(12) United States Patent
Fujino et al.

(10) Patent No.: US 9,306,020 B2
(45) Date of Patent: Apr. 5, 2016

(54) POWER MODULE AND METHOD OF MANUFACTURING THE POWER MODULE

(75) Inventors: Shinichi Fujino, Hitachinaka (JP);
Hideto Yoshinari, Hitachinaka (JP);
Shiro Yamashita, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/123,909

(22) PCT Filed: Jun. 28, 2012

(86) PCT No.: PCT/JP2012/066571
§ 371 (c)(1),
(2), (4) Date: Dec. 4, 2013

(87) PCT Pub. No.: WO2013/002338
PCT Pub. Date: Jan. 3, 2013

(65) Prior Publication Data
US 2014/0110752 A1    Apr. 24, 2014

(30) Foreign Application Priority Data
Jun. 29, 2011    (JP) ................. 2011-144593

(51) Int. Cl.
*H01L 29/66*    (2006.01)
*H01L 29/45*    (2006.01)
(Continued)

(52) U.S. Cl.
CPC ............... *H01L 29/45* (2013.01); *H01L 23/36* (2013.01); *H01L 23/4334* (2013.01);
(Continued)

(58) Field of Classification Search
CPC ........... H01L 2224/05647; H01L 2224/48747; H01L 2224/83192; H01L 23/4824; H01L 23/488; H01L 23/492; H01L 29/41708; H01L 29/45; H01L 2924/01029; H01L 2924/014; H01L 2924/1305; H01L 2924/13055
USPC .................. 257/133, 565, 577, 910, E21.382, 257/E27.016, E27.017, E27.019, E27.037, 257/E29.027, E29.066, E29.197
See application file for complete search history.

(56) References Cited

U.S. PATENT DOCUMENTS 6,906,410 B2 *    6/2005    Aono et al. ................... 257/691
8,232,629 B2 *    7/2012    Koike et al. ................... 257/691
(Continued)

FOREIGN PATENT DOCUMENTS

DE    10 2006 040 820 A1    3/2008
EP    0 143 244 A2    6/1985
(Continued)

OTHER PUBLICATIONS

International Search Report with English translation dated Aug. 14, 2012 (5 pages).
(Continued)

*Primary Examiner* — Kyoung Lee
*Assistant Examiner* — Joannie A Garcia
(74) *Attorney, Agent, or Firm* — Crowell & Moring LLP

(57) ABSTRACT

A power module includes a semiconductor device having at least one electrode surface on each side thereof, a first conductive member connected to the electrode surface provided on one side of the semiconductor device with solder, and a second conductive member connected to the electrode surface provided on the other side of the semiconductor device with solder, with at least one of the electrode surfaces provided on the one side of the semiconductor device being double comb-shaped.

11 Claims, 15 Drawing Sheets

(51) Int. Cl.

| | | |
|---|---|---|
| *H01L 25/18* | (2006.01) | |
| *H01L 23/00* | (2006.01) | |
| *H01L 23/36* | (2006.01) | |
| *H01L 23/433* | (2006.01) | |
| *H01L 23/495* | (2006.01) | |
| *H01L 23/482* | (2006.01) | |
| *H01L 29/417* | (2006.01) | |
| *H01L 23/488* | (2006.01) | |
| *H01L 23/492* | (2006.01) | |
| *H01L 23/473* | (2006.01) | |

(52) U.S. Cl.
CPC ......... *H01L 23/488* (2013.01); *H01L 23/4824* (2013.01); *H01L 23/492* (2013.01); *H01L 23/49524* (2013.01); *H01L 23/49531* (2013.01); *H01L 23/49575* (2013.01); *H01L 24/05* (2013.01); *H01L 24/32* (2013.01); *H01L 24/33* (2013.01); *H01L 24/40* (2013.01); *H01L 24/73* (2013.01); *H01L 24/83* (2013.01); *H01L 24/95* (2013.01); *H01L 25/18* (2013.01); *H01L 29/41708* (2013.01); *H01L 23/473* (2013.01); *H01L 24/45* (2013.01); *H01L 24/48* (2013.01); *H01L 2224/04042* (2013.01); *H01L 2224/05552* (2013.01); *H01L 2224/26175* (2013.01); *H01L 2224/27013* (2013.01); *H01L 2224/291* (2013.01); *H01L 2224/29101* (2013.01); *H01L 2224/32245* (2013.01); *H01L 2224/40137* (2013.01); *H01L 2224/45124* (2013.01); *H01L 2224/48091* (2013.01); *H01L 2224/48247* (2013.01); *H01L 2224/73215* (2013.01); *H01L 2224/73221* (2013.01); *H01L 2224/73263* (2013.01); *H01L 2224/73265* (2013.01); *H01L 2224/83192* (2013.01); *H01L 2224/83815* (2013.01); *H01L 2224/85005* (2013.01); *H01L 2224/92247* (2013.01); *H01L 2924/1305* (2013.01); *H01L 2924/1306* (2013.01); *H01L 2924/13055* (2013.01); *H01L 2924/13091* (2013.01)

(56) References Cited

U.S. PATENT DOCUMENTS

| | | | |
|---|---|---|---|
| 2004/0214419 | A1 | 10/2004 | Aono et al. |
| 2008/0054422 | A1 | 3/2008 | Koike et al. |
| 2008/0158823 | A1* | 7/2008 | Tominaga ........... B60R 16/0239 361/709 |
| 2009/0246910 | A1 | 10/2009 | Taniguchi et al. |
| 2010/0059875 | A1 | 3/2010 | Sato et al. |
| 2012/0300522 | A1 | 11/2012 | Tokuyama et al. |

FOREIGN PATENT DOCUMENTS

| | | |
|---|---|---|
| GB | 2 150 754 A | 7/1985 |
| JP | 2003-258179 A | 9/2003 |
| JP | 2004-221269 A | 8/2004 |
| JP | 2006-210519 A | 8/2006 |
| JP | 2008-60256 A | 3/2008 |
| JP | 2009-231690 A | 10/2009 |
| JP | 2010-67755 A | 3/2010 |
| JP | 2013-12596 A | 1/2013 |
| WO | WO 2011/040153 A1 | 4/2011 |

OTHER PUBLICATIONS

Extended European Search Report issued in counterpart European Application No. 12804282.7 dated Jun. 22, 2015 (Ten (10) pages).

* cited by examiner

B-B CROSS-SECTION (a)

ENLARGED VIEW OF PART D (b)

(a)

(b)

(c)

(a)

(b)

(a)

(b)

POWER MODULE AND METHOD OF MANUFACTURING THE POWER MODULE

TECHNICAL FIELD

The present invention relates to a power module configured so that both sides of a semiconductor device are connected to conductive members with solder.

BACKGROUND ART

A power semiconductor device such as an IGBT chip is used as a power module mounted, for example, on a power converter for a hybrid electric car and a pure electric car. The IGBT chip has a structure where several thousands to several tens of thousands of IGBT cells are repeatedly arranged. The IGBT chip is a three-terminal device having an emitter electrode, a collector electrode, and a gate electrode, in the structure of which the emitter electrode and the gate electrode are formed in an insulated state on the same plane of the IGBT chip.

In order to reduce the variation of the propagation delay time of a control signal, the gate electrode is connected to a gate wiring made of a material having a high conductivity such as aluminum, and the gate wiring is connected to a gate of the IGBT cell, for example, through a polysilicon wiring.

The emitter electrode of the IGBT chip is generally divided into multiple regions by the gate wiring (see PTL 1). The emitter electrode divided may be connected to a conductive member with solder.

In the power module mounted, for example, on a power converter for a hybrid electric car and a pure electric car, the input current tends to be increased as systems in recent years are powered up. When solder is used to connect a semiconductor device and a conductive member, an increase in the input current increases the temperature change of the semiconductor device, resulting in the degradation of the solder connecting the semiconductor device and the conductive member. Since the degradation of the solder affects the void fraction, suppression of voids that occur during soldering is an important issue in improving the life of the solder to a temperature change.

CITATION LIST

Patent Literature

PTL 1: JP 2004-221269A

SUMMARY OF INVENTION

Technical Problem

In a common type of power module, such as described in PTL 1, an emitter electrode is divided into multiple regions by aluminum gate wiring having a small electric resistance compared to polysilicon wiring. The aluminum gate wiring is covered with a protective film having insulating properties, such as polyimide resin having low wettability to solder.

Thus, when an emitter electrode surface and a conductive member are connected with the solder, spreading of the solder on the emitter electrode surface of an IGBT chip is limited by the protective film and the solder flows unevenly, and this leads to a problem that the void fraction becomes high. In addition, since the spreading direction of the solder is limited to a predetermined direction, the solder flows too much in that direction, and the solder may flow beyond the emitter electrode surface of the IGBT chip.

Solution to Problem

A power module according to a first aspect of the invention includes: a semiconductor device having at least one electrode surface on each side thereof; a first conductive member connected to the electrode surface provided on one side of the semiconductor device with solder; and a second conductive member connected to the electrode surface provided on the other side of the semiconductor device with solder, with at least one of the electrode surfaces provided on the one side of the semiconductor device being double comb-shaped.

According to a second aspect of the invention, which is the power module of the first aspect, the double comb-shaped electrode surface preferably has a primary solder spreading electrode surface and a secondary solder spreading electrode surface extending in a comb-like manner from the primary solder spreading electrode surface to both sides thereof.

According to a third aspect of the invention, which is the first or second power module, preferably the periphery of the double comb-shaped electrode surface is provided with a gate wiring, and the gate wiring is covered with a protective film having low wettability to solder compared to the double comb-shaped electrode surface and insulating properties.

According to a fourth aspect of the invention, which is the power module of any one of the first to third aspects, preferably the first and second conductive members are made of copper material, and no surface treatment is applied to the surface of the first and second conductive members to be soldered.

A power module according to a fifth aspect of the invention includes: an IGBT chip and a diode chip; a first conductive plate that is connected with solder to an emitter electrode surface provided on one side of the IGBT chip and to an anode electrode surface provided on one side of the diode chip; and a second conductive plate that is connected with solder to a collector electrode surface provided on the other side of the IGBT chip and to a cathode electrode surface provided on the other side of the diode chip. At least one of the emitter electrode surfaces provided on the one side of the IGBT chip is double comb-shaped, the double comb-shaped electrode surface has a primary solder spreading electrode surface and a secondary solder spreading electrode surface extending in a comb-like manner from the primary solder spreading electrode surface to both sides thereof, the periphery of the emitter electrode surface is provided with a gate wiring, and the gate wiring is covered with a protective film having low wettability to solder compared to the emitter electrode surface and insulating properties.

A power module according to a sixth aspect of the invention includes: an upper arm IGBT chip and an upper arm diode chip and a lower arm IGBT chip and a lower arm diode chip that make up an upper arm and a lower arm of an inverter circuit; a second AC electrode lead frame that is connected with solder to at least one emitter electrode surface provided on one side of the upper arm IGBT chip and to an anode electrode surface provided on one side of the upper arm diode chip; a DC positive electrode lead frame that is connected with solder to a collector electrode surface provided on the other side of the upper arm IGBT chip and to a cathode electrode surface provided on the other side of the upper arm diode chip; a DC negative electrode lead frame that is connected with solder to at least one emitter electrode surface provided on one side of the lower arm IGBT chip and to an anode electrode surface provided on one side of the lower arm diode chip; and a first AC electrode lead frame that is connected with solder to a collector electrode surface provided on the other side of the lower arm IGBT chip and to a cathode electrode surface provided on the other side of the lower arm diode chip. At least one of the emitter electrode surfaces provided on each of the one sides of the upper arm IGBT chip and the lower arm IGBT chip is double comb-shaped, the double comb-shaped electrode surface has a primary solder spreading electrode surface and a secondary solder spreading electrode surface extending in a comb-like manner from the primary solder spreading electrode surface to both sides thereof, the periphery of the emitter electrode surface is provided with a gate wiring, and the gate wiring is covered with a protective film having low wettability to solder compared to the emitter electrode surface and insulating properties.

According to a seventh aspect of the invention, which is the power module of any one of the first to sixth aspects, nickel plating to improve the wettability to solder is preferably applied to the double comb-shaped electrode surface.

A method of manufacturing a power module according to an eighth aspect of the invention, which is a method of manufacturing the power module of any one of the second to fourth aspects, includes: preparing the semiconductor device having at least one double comb-shaped electrode surface, the first conductive member, and the second conductive member; connecting the electrode surface provided on the other side of the semiconductor device to the second conductive member with solder; dropping molten solder on a predetermined region including part of the primary solder spreading electrode surface constituting the double comb-shaped electrode surface of the semiconductor device or on a region of the first conductive member facing the predetermined region; spreading the molten solder from the primary solder spreading electrode surface to the secondary solder spreading electrode surface by reducing a distance between the first conductive member and the electrode surface provided on the one side of the semiconductor device and connecting the electrode surface provided on the one side of the semiconductor device to the first conductive member with solder; and sealing the first and second conductive members with a sealing member.

A method of manufacturing a power module according to an ninth aspect of the invention, which is a method of manufacturing the power module of any one of the second to fourth aspects, includes: preparing the semiconductor device having at least one double comb-shaped electrode surface, the first conductive member, and the second conductive member; connecting the electrode surface provided on the other side of the semiconductor device to the second conductive member with solder; dropping molten solder on a dropping region of the first conductive member; performing positioning such that the solder dropped on the dropping region is disposed so as to face a predetermined region including part of the primary solder spreading electrode surface constituting the double comb-shaped electrode surface provided on the one side of the semiconductor device; moving the one side of the semiconductor device toward the first conductive member, spreading the molten solder from the primary solder spreading electrode surface to the secondary solder spreading electrode surface, and connecting the electrode surface provided on the one surface of the semiconductor device to the first conductive member with solder; and sealing the first and second conductive members with a sealing member.

A method of manufacturing a power module according to an tenth aspect of the invention, which is a method of manufacturing the power module of the fifth aspect, includes: preparing the IGBT chip having at least one double comb-shaped emitter electrode surface, the diode chip, the first conductive plate, and the second conductive plate; dropping molten solder at the center positions of the collector electrode surface of the IGBT chip and the cathode electrode surface of the diode chip or at predetermined positions of the second conductive plate facing the center positions thereof; simultaneously moving the collector electrode surface of the IGBT chip and the cathode electrode surface of the diode chip toward the second conductive plate, spreading the molten solder on the collector electrode surface and the cathode electrode surface, and connecting the collector electrode surface of the IGBT chip and the cathode electrode surface of the diode chip to the second conductive plate with solder; dropping molten solder at a predetermined region including part of the primary solder spreading electrode surface constituting the emitter electrode surface of the IGBT chip and at the center position of the anode electrode surface of the diode chip or at predetermined positions of the first conductive plate facing the predetermined region and the center position of the anode electrode surface; simultaneously moving the emitter electrode surface of the IGBT chip and the anode electrode surface of the diode chip toward the first conductive plate, spreading the molten solder from the primary solder spreading electrode surface to the secondary solder spreading electrode surface of the emitter electrode surface and spreading the molten solder on the anode electrode surface, and connecting the emitter electrode surface of the IGBT chip and the anode electrode surface of the diode chip to the first conductive plate with solder; and sealing the first and second conductive plates with a sealing member.

A method of manufacturing a power module according to an eleventh aspect of the invention, which is a method of manufacturing the power module of any one of the second to fourth aspects, includes: preparing the semiconductor device having at least one double comb-shaped electrode surface, the first conductive member, and the second conductive member; connecting the electrode surface provided on the other side of the semiconductor device to the second conductive member with solder; placing solder at a predetermined region including part of the primary solder spreading electrode surface constituting the double comb-shaped electrode surface of the semiconductor device or at a region of the first conductive member facing the predetermined region; melting the solder by heating, spreading the molten solder from the primary solder spreading electrode surface to the secondary solder spreading electrode surface by reducing a distance between the first conductive member and the electrode surface provided on the one side of the semiconductor device, and connecting the electrode surface provided on the one side of the semiconductor device to the first conductive member with solder; and sealing the first and second conductive members with a sealing member.

Advantageous Effects of Invention

The present invention suppresses the occurrence of voids and controls solder flow, and can prolong the life of a solder joint, thereby providing a power module with a high reliability and a manufacturing method thereof.

DESCRIPTION OF EMBODIMENTS

Figure 1:
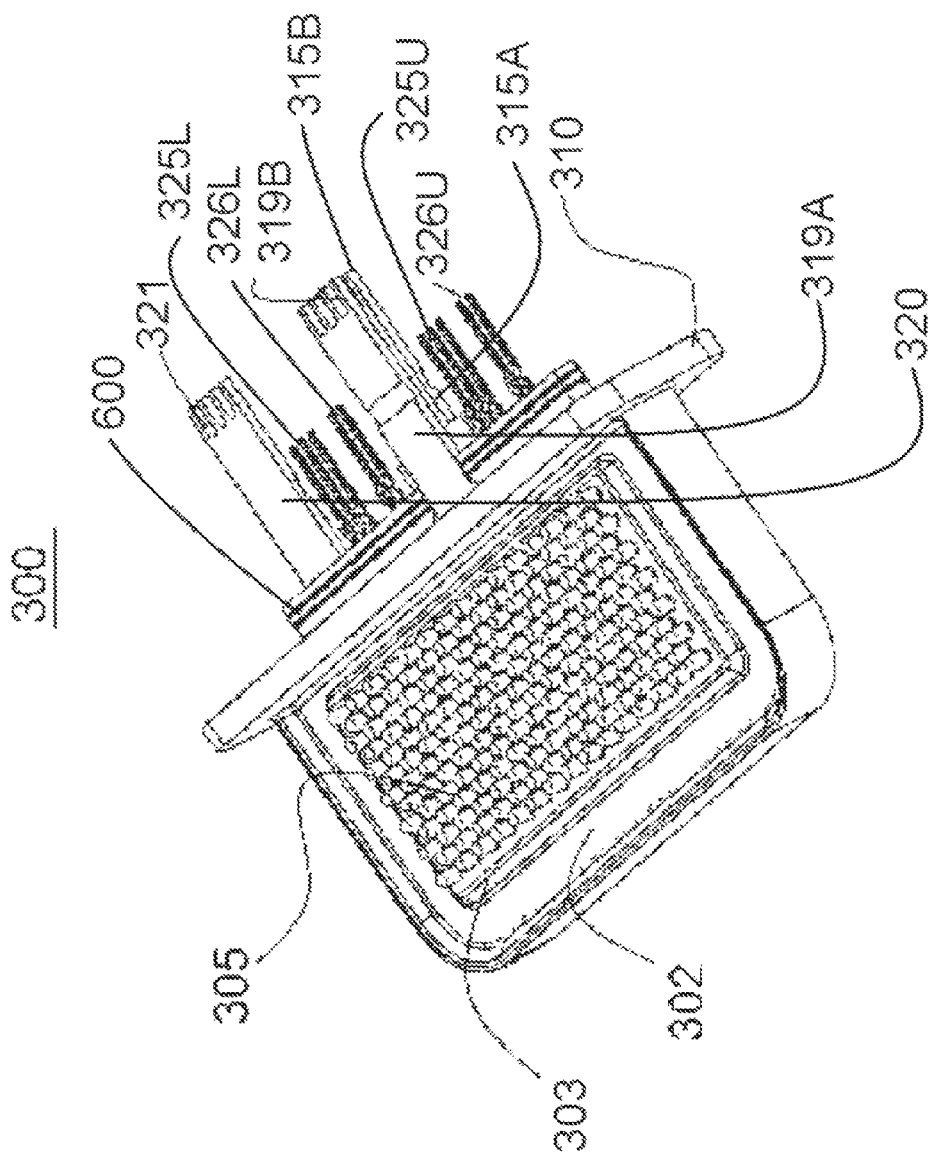
FIG. 1 is a perspective view showing the appearance of a power module.
Figure 2:
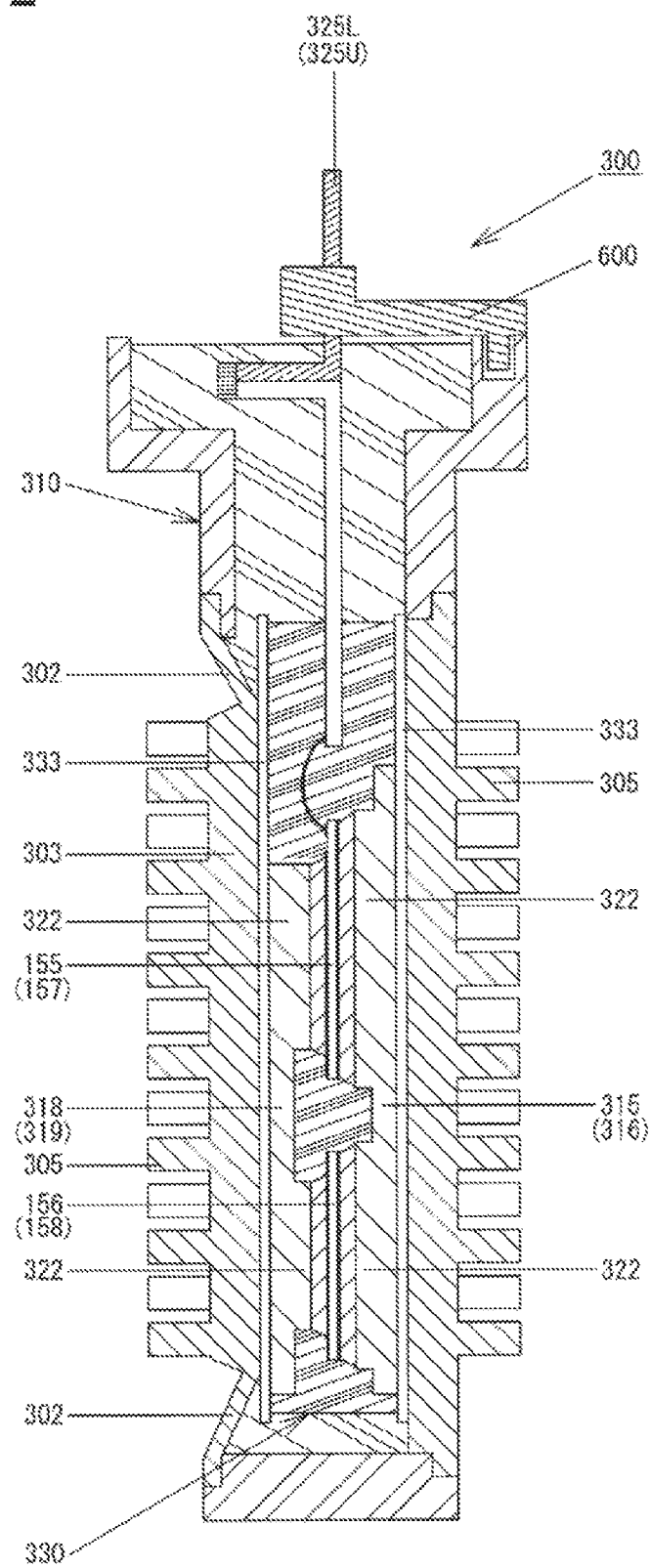
FIG. 2 is a schematic cross-sectional view of the power module.

Embodiments of the present invention will now be described with reference to the drawings. FIG. 1 is a perspective view showing the appearance of a power module 300, and FIG. 2 is a schematic cross-sectional view of the power module 300. The power module 300 houses a power semiconductor unit 330 (see FIG. 2), which includes a switching device and is transfer molded, in a metal module case 310. The power module 300 is used as a power converter mounted on an electric vehicle such as a pure electric car and a hybrid electric car.

The module case 310 has a pair of heat sinks provided with a plurality of heat dissipation fins 305. The heat sinks are made of a metal such as aluminum having a high thermal conductivity. As shown in FIG. 2, a heat sink located in the left side of the drawing has a thick portion 303 on which the heat dissipation fins 305 are erected and a thin portion 302 provided on the periphery thereof. The heat dissipation surface of the power semiconductor unit 330 housed inside and the inner peripheral surface of the thick portion 303 are in close contact by plastically deforming the thin portion 302. From one side of the module case 310, as shown in FIG. 1, a DC positive electrode terminal 315B, a DC negative electrode terminal 319B, an AC terminal 321, and signal terminals 325L, 325U, 326L, and 326U provided in the power semiconductor unit 330 are protruded.

Figure 3:
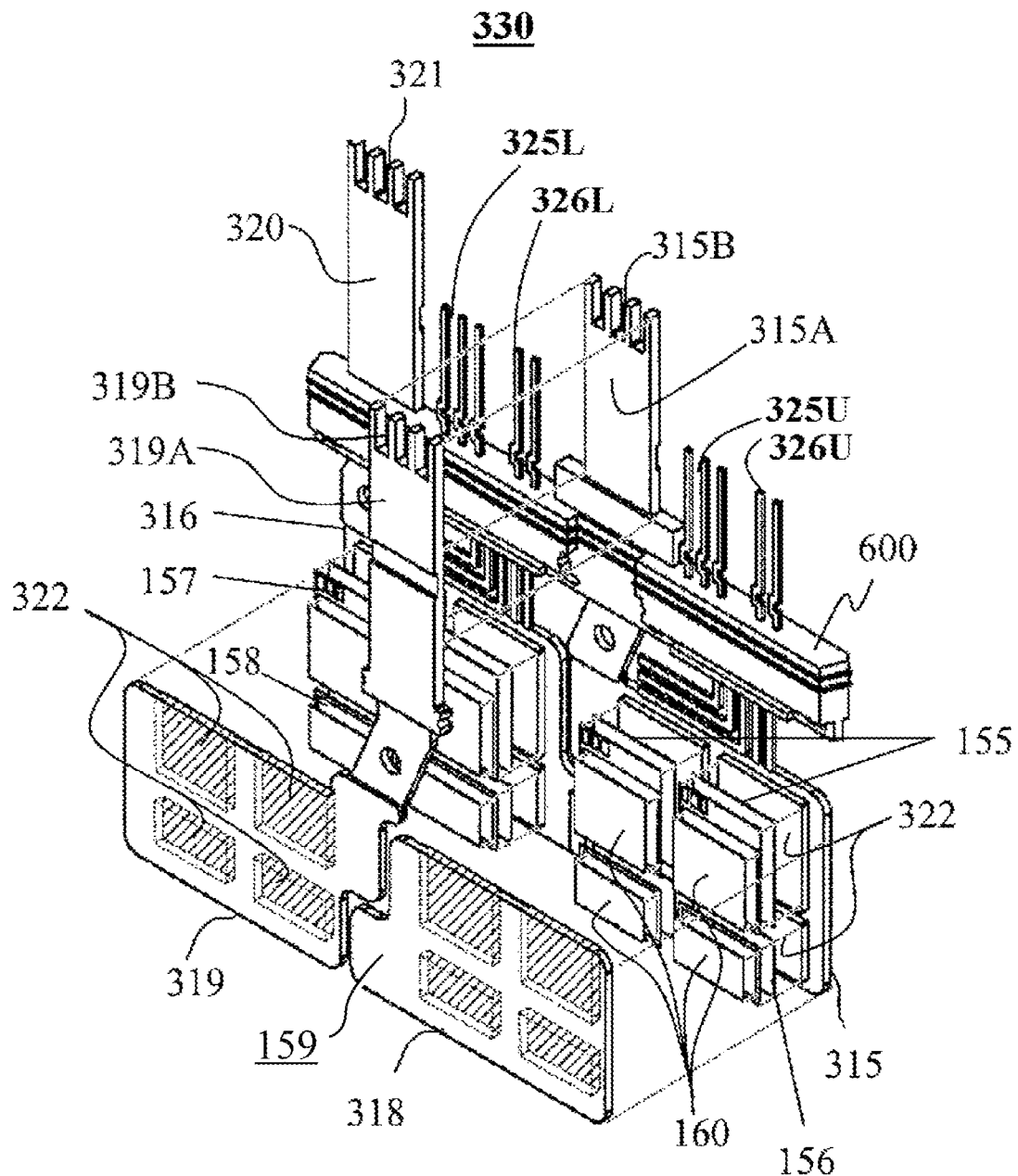
FIG. 3 is an exploded perspective view of a power semiconductor unit.
Figure 4:
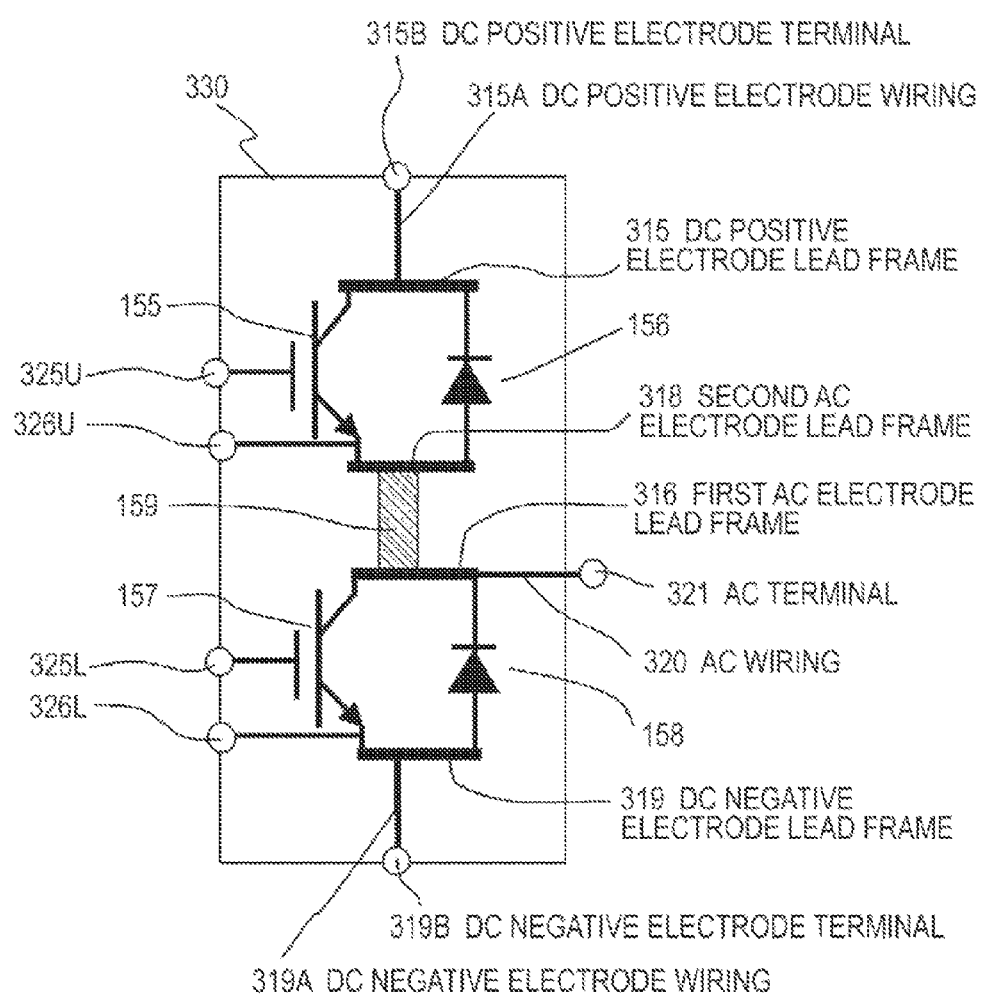
FIG. 4 is a circuit diagram of the power semiconductor unit.

FIG. 3 is an exploded perspective view of the power semiconductor unit 330, and FIG. 4 is a circuit diagram of the power semiconductor unit 330. A transfer mold is not shown in FIG. 3. In the present embodiment, insulated-gate bipolar transistor (IGBT) chips 155 and 157 and diode chips 156 and 158 are provided as a power semiconductor device. While each two of the IGBT chips 155 and 157 and the diode chips 156 and 158 are disposed in parallel in the example shown in FIG. 3, only one of them is shown in order to simplify the description in the circuit diagram of FIG. 4.

As shown in FIG. 3, a DC positive electrode lead frame 315 and a first AC electrode lead frame 316 are disposed in substantially the same plane on one side across the power semiconductor devices, and a second AC electrode lead frame 318 and a DC negative electrode lead frame 319 are disposed in substantially the same plane on the other side.

The power semiconductor devices are flat plate-like structures and the front and back sides thereof are equipped with electrodes. On a device securing region 322 of the DC positive electrode lead frame 315, the collector electrode of an upper arm IGBT chip 155 and the cathode electrode of an upper arm diode chip 156 are secured by solder 160.

On the other hand, on the device securing region 322 of the first AC electrode lead frame 316, the collector electrode of a lower arm IGBT chip 157 and the cathode electrode of a lower arm diode chip 158 are secured by solder 160.

On the device securing region 322 of the second AC electrode lead frame 318, the emitter electrode of the upper arm IGBT chip 155 and the anode electrode of the upper arm diode chip 156 are secured by solder 160. On the other hand, on the device securing region 322 of the DC negative electrode lead frame 319, the emitter electrode of the lower arm IGBT chip 157 and the anode electrode of the lower arm diode chip 158 are secured by solder 160.

As shown in FIG. 3, the DC positive electrode lead frame 315 and the second AC electrode lead frame 318 are opposed substantially in parallel so as to sandwich the IGBT chips 155 and the diode chips 156. Likewise, the first AC electrode lead frame 316 and the DC negative electrode lead frame 319 are opposed substantially in parallel so as to sandwich the IGBT chips 157 and the diode chips 158. As shown in FIG. 4, the first AC electrode lead frame 316 and the second AC electrode lead frame 318 are connected via an intermediate electrode 159. Connection via the intermediate electrode 159 allows an upper arm circuit and a lower arm circuit to be connected, thereby forming a series circuit with the upper and lower arms as shown in FIG. 4.

As shown in FIG. 3, a DC positive electrode wiring 315A is formed integrally with the DC positive electrode lead frame 315, and the distal end of the DC positive electrode wiring 315A is provided with the DC positive electrode terminal 315B. Likewise, a DC negative electrode wiring 319A is formed integrally with the DC negative electrode lead frame 319, and the distal end of the DC negative electrode wiring 319A is provided with the DC negative electrode terminal 319B. An AC wiring 320 is formed integrally with the first AC electrode lead frame 316, and the end of the AC wiring 320 is provided with the AC terminal 321.

A thermoplastic resin terminal block 600 is provided between the DC positive electrode wiring 315A and the DC negative electrode wiring 319A. As shown in FIG. 1, the DC positive electrode wiring 315A and the DC negative electrode wiring 319A extend to protrude from the module case 310, being opposite and substantially parallel to each other. The signal terminals 325L, 325U, 326L, and 326U are integrally molded in the thermoplastic resin terminal block 600 and extend to protrude from the module case 310 in a direction similar to the DC positive electrode wiring 315A and the DC negative electrode wiring 319A. Accordingly, insulation between the DC positive electrode wiring 315A and the DC negative electrode wiring 319A and insulation between the signal wirings and wiring boards can be secured, and high-density wirings are possible.

As a resin material used for the thermoplastic resin terminal block 600, a thermoplastic resin is suitable that has a heat resistance temperature equal to or higher than that of a mold of a transfer molding (e.g., 180° C. or more) and insulation properties, so that polyphenylene sulfide (PPS), liquid crystal polymer (LCP), etc. are used.

Figure 5:
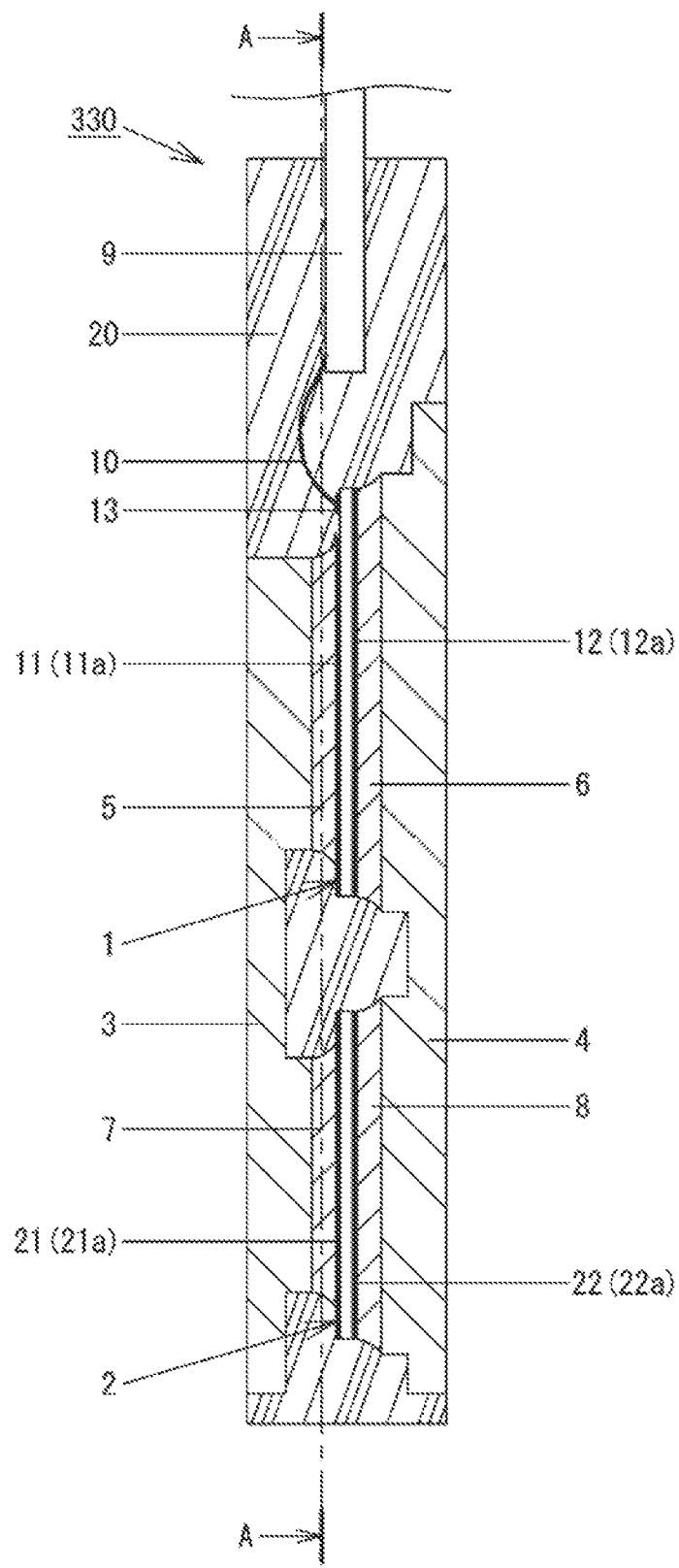
FIG. 5 is a schematic cross-sectional view of the power semiconductor unit.
Figure 6:
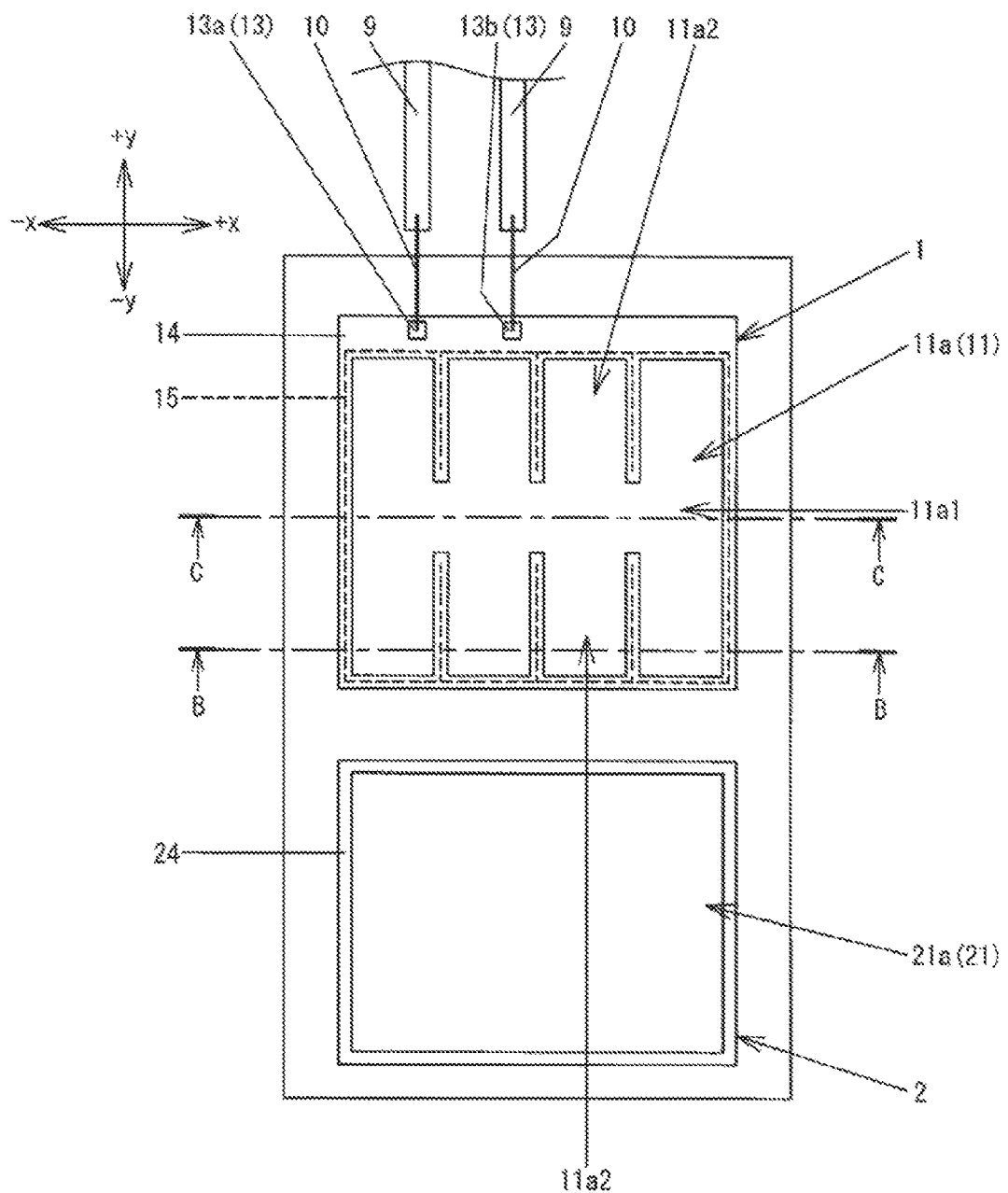
FIG. 6 is a schematic diagram illustrating an emitter electrode surface of an IGBT chip and an anode electrode surface of a diode chip.

FIG. 5 is a schematic cross-sectional view of the power semiconductor unit 330. FIG. 6 is a schematic diagram illustrating an electrode surface 11a of an emitter electrode 11 of an IGBT chip 1 and an electrode surface 21a of an anode electrode 21 of a diode chip 2, where FIG. 6 is an A-A cross-sectional view of FIG. 5. In FIG. 6, a sealing member 20 and solders 5 and 7 are not illustrated. Note that, as shown in FIG. 6, a direction in which the IGBT chip 1 and the diode chip 2 are aligned in a row is defined as the y direction, and a direction perpendicular to the y direction is defined as the x direction.

Since upper arm components such as the upper arm IGBT chip, the upper arm diode chip, and various wirings for an upper arm and lower arm components such as the lower arm IGBT chip, the lower arm diode chip, and various wirings for a lower arm are almost the same configuration, the upper arm components and the lower arm components are defined and described as follows.

The upper arm IGBT chip 155 and the lower arm IGBT chip 157 are merely referred to as the IGBT chip 1, and the upper arm diode chip 156 and the lower arm diode chip 158 are merely referred to as the diode chip 2. The second AC electrode lead frame 318 and the DC negative electrode lead frame 319 are merely referred to as a first bus bar 3, and the DC positive electrode lead frame 315 and the first AC electrode lead frame 316 are merely referred to as a second bus bar 4. Each of signal wirings including the signal terminals 325U, 325L, 326L, and 326U is referred to as a gate pin 9.

As shown in FIGS. 5 and 6, one side of the IGBT chip 1 is provided with the electrode surface 11a of the emitter electrode 11 and terminal electrodes 13, i.e., an emitter terminal electrode 13a and a gate terminal electrode 13b, and the other side thereof is provided with an electrode surface 12a of a collector electrode 12. A drive signal from a driver circuit (not shown) connected to the power module is input to the gate terminal electrode 13b. Information of the current flowing through the emitter electrode 11 of the IGBT chip 1 is output from the emitter terminal electrode 13a. The IGBT chip 1 of the present embodiment is approximately the size of 10 mm×10 mm.

The electrode surface 11a of the emitter electrode 11 is connected to the first bus bar 3 with solder 5. The electrode surface 12a of the collector electrode 12 is connected to the second bus bar 4 with solder 6. The emitter terminal electrode 13a and the gate terminal electrode 13b are connected to the gate pin 9 by aluminum wire 10.

One side of the diode chip 2 is provided with the electrode surface 21a of the anode electrode 21, and the other side thereof is provided with an electrode surface 22a of a cathode electrode 22. The electrode surface 21a of the anode electrode 21 is connected with solder 7 on the same plane as that of the first bus bar 3 where the IGBT chip 1 is connected. The electrode surface 22a of the cathode electrode 22 is connected with solder 8 on the same plane as that of the second bus bar 4 where the IGBT chip 1 is connected.

An emitter electrode surface 11a, an anode electrode surface 21a, a collector electrode surface 12a, and a cathode electrode surface 22a are given surface processing, for example, such as nickel plating, that can be soldered. On the other hand, the first bus bar 3 and the second bus bar 4 are made of copper material, surface processing such as plating is not applied to the surface of the first bus bar 3 and the second bus bar 4 to be soldered, and the surface thereof is a solid copper material.

As shown in FIG. 5, the IGBT chip 1 and the diode chip 2 sandwiched between the first bus bar 3 and the second bus bar 4 and the aluminum wire 10 that connects the IGBT chip 1 and the gate pin 9 are sealed by the sealing member 20 made of an insulating organic material such as an epoxy resin having insulating properties. The other end of the connection portion of the gate pin 9 with the aluminum wire 10 protrudes outside of the sealing member 20, and is used as an external interface for the drive signal.

As shown in FIG. 2, the side opposite to the side on which the IGBT chip 1 (155, 157) and the diode chip 2 (156, 158) are connected in the first bus bar 3 (318, 319) and the second bus bar 4 (315, 316) is exposed without being sealed with a resin. The exposed side thereof is in contact with the inner surface of the module case 310 through an insulation sheet 333 and the like. Accordingly, heat generated from the IGBT chip 1 and the diode chip 2 is transmitted to the heat dissipation fins 305 of the module case 310 and the surface of the module case 310 through the first bus bar 3 (318, 319), the second bus bar 4 (315, 316), and the insulation sheet 333, and the heat is released from the refrigerant (not shown) in contact with the surfaces of the heat dissipation fins 305 and the module case 310.

As shown in FIG. 6, the electrode surface 11a of the emitter electrode 11 is double comb-shaped with four pairs of strip-shaped electrode surfaces protruding in the +y and −y directions from an electrode surface extending in the x direction in a plan view. Specifically, the electrode surface 11a of the emitter electrode 11 has a primary solder spreading electrode surface 11a1 extending in the x direction in the center portion as illustrated and a secondary solder spreading electrode surface 11a2 extending in a comb-like manner from the primary solder spreading electrode surface 11a1 to both sides, i.e., in the +y and −y directions.

The electrode surface 21a of the anode electrode 21 of the diode chip 2 is rectangular in a plan view as illustrated. Although not illustrated, the electrode surface 12a of the collector electrode 12 of the IGBT chip 1 and the electrode surface 22a of the cathode electrode 22 of the diode chip 2 are rectangular in a plan view.

Figure 7:
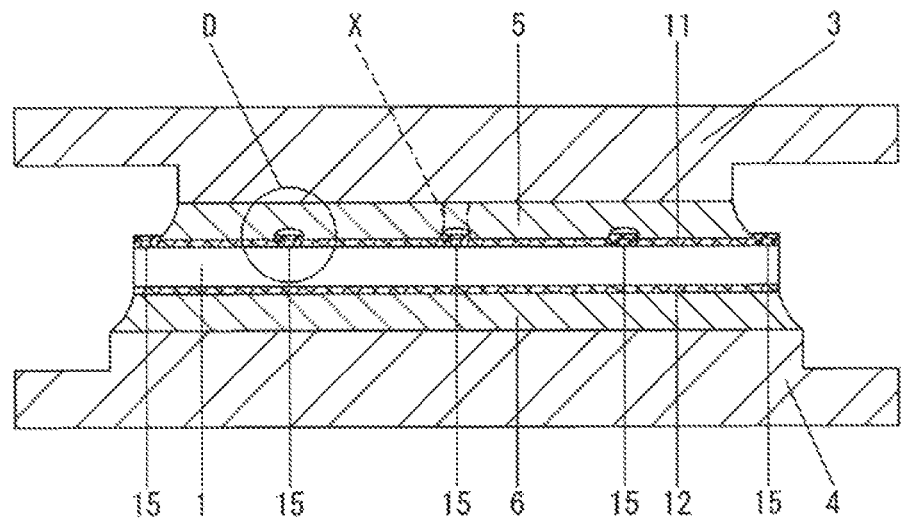
FIG. 7(a) is a schematic cross-sectional view of the power semiconductor unit taken along line B-B of FIG. 6.
FIG. 7(b) is an enlarged view of a part D of FIG. 7(a).
Figure 7:
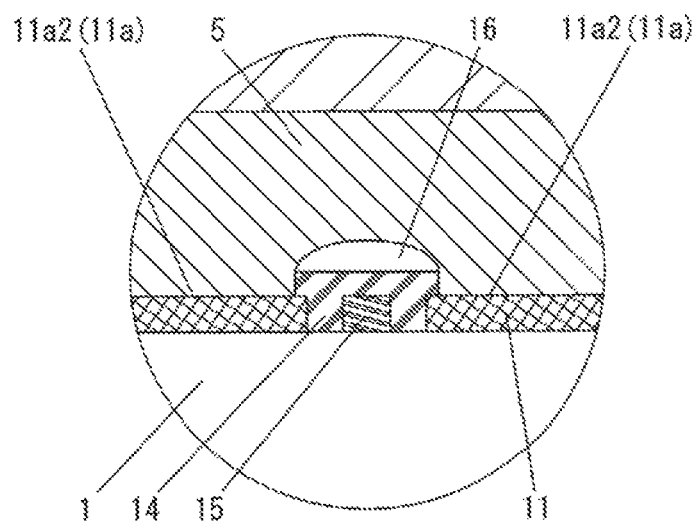
Figure 8:
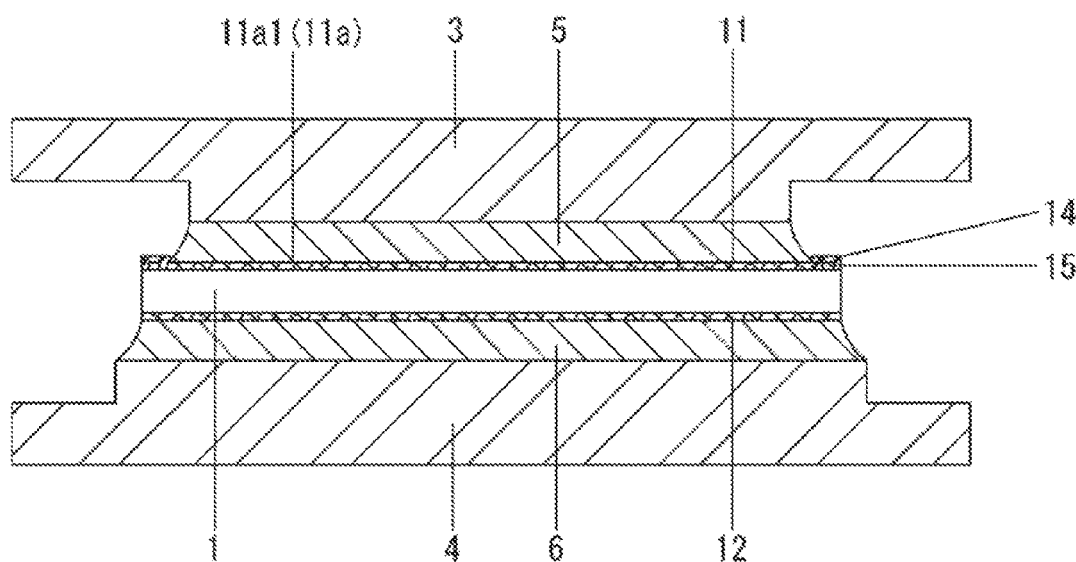
FIG. 8 is a schematic cross-sectional view of the power semiconductor unit taken along line C-C of FIG. 6.

FIG. 7(a) is a schematic cross-sectional view of the power semiconductor unit 330 taken along line B-B of FIG. 6, and FIG. 7(b) is an enlarged view of a part D of FIG. 7(a). FIG. 8 is a schematic cross-sectional view of the power semiconductor unit 330 taken along line C-C of FIG. 6. The sealing member 20 is not shown in FIGS. 7 and 8. As shown in FIGS. 6 and 7, an aluminum gate wiring 15 to connect a gate (not shown) and the gate terminal electrode 13b of each IGBT cell is provided between the strip-shaped electrode surfaces adjacent to each other that constitute the secondary solder spreading electrode surface 11a2.

Although not shown, the aluminum gate wiring 15 and the gate of each IGBT cell are connected, for example, through a polysilicon wiring. The electrical resistance of the polysilicon wiring is tens to hundreds times higher than that of the aluminum gate wiring 15. Therefore a long polysilicon wiring increases electrical resistance to each IGBT cell, resulting in degradation of the response of each IGBT cell. In the present embodiment, the aluminum gate wiring 15 is provided on the periphery of the emitter electrode surface 11a including a space between the strip-shaped electrode surfaces adjacent to each other that constitute the secondary solder spreading electrode surface 11a2, and this shortens the polysilicon wiring.

As shown in FIGS. 6 to 8, the aluminum gate wiring 15 is covered by a protective film 14 having insulating properties. A protective film is applied on the entire surface of the IGBT chip 1 including the electrode surfaces, and the protective film on the electrode surfaces is removed by etching after drying. Thus, as shown in FIGS. 7 and 8, the protective films 14 covering the aluminum gate wiring 15 are formed on the chip electrode surfaces. As shown in FIG. 6, the periphery of the electrode surface 21a of the anode electrode 21 of the diode chip 2 is provided with a protective film 24 having insulating properties. For example, polyimide resin and polyamide resin may be used as the protective films 14 and 24.

The protective films 14 have low wettability to solder compared to the emitter electrode surface 11a of the IGBT chip 1. Accordingly, as shown in FIG. 7(b), space where the solder 5 does not get wet and spread, i.e., a non-wetted space 16 where the solder 5 is not present, is formed on the protective films 14 formed between the strip-shaped electrode surfaces adjacent to each other that constitute the secondary solder spreading electrode surface 11a2 of the IGBT chip 1. Note that the non-wetted space 16 may communicate with the first bus bar 3 as shown by a broken line X in FIG. 7(a).

As shown in FIG. 8, the protective film 14 does not exist on the C-C cross section of FIG. 6, and the non-wetted space 16 does not exist except for soldering defects (not shown) such as voids (fine cavities). Thus, the non-wetted space 16 exists on the protective film 14 formed between the strip-shaped electrode surfaces adjacent to each other that constitute the secondary solder spreading electrode surface 11a2 (see FIG. 7).

Figure 9:
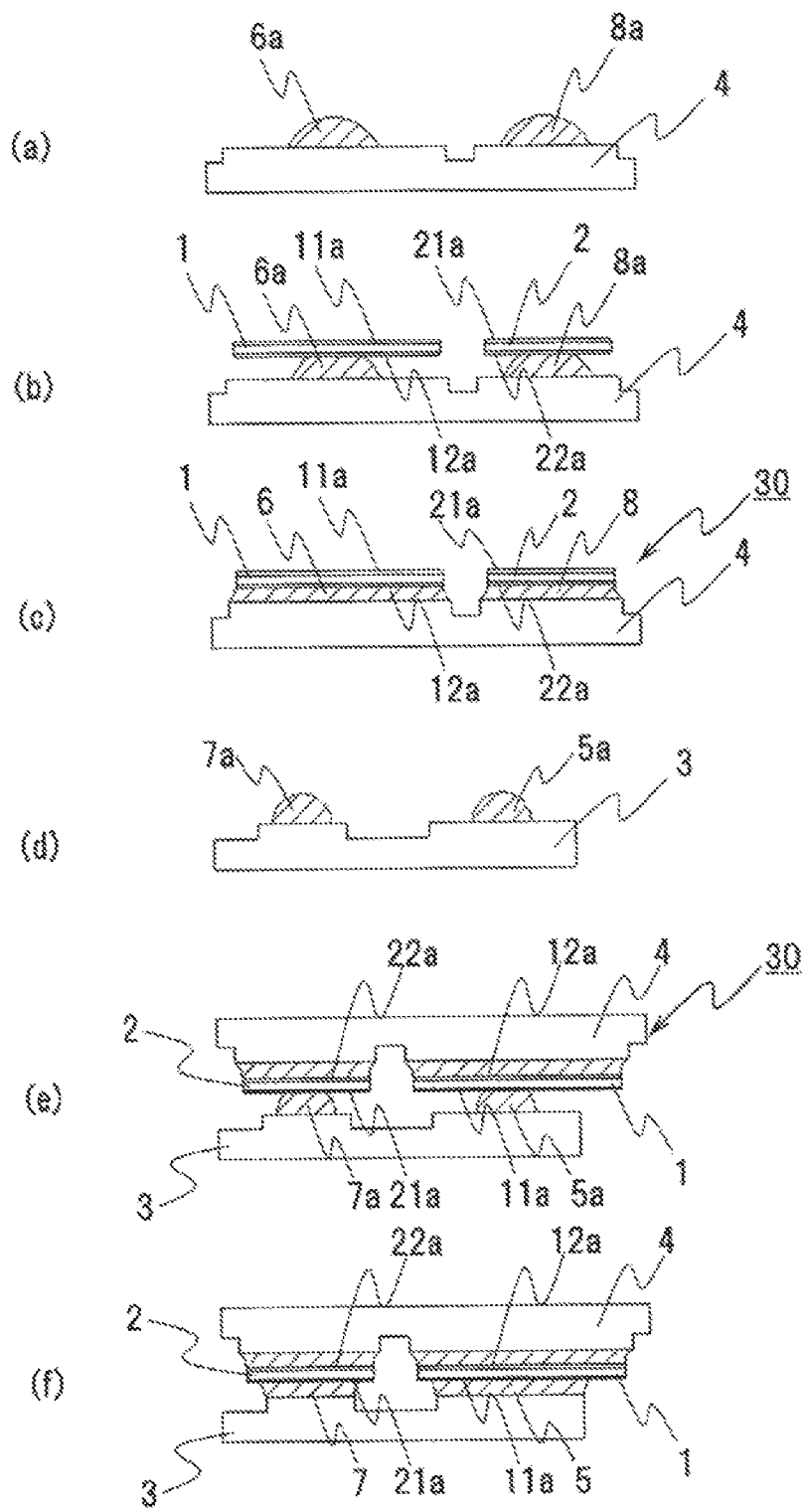
FIG. 9 is a process diagram illustrating a manufacturing method of the power semiconductor unit.
Figure 10:
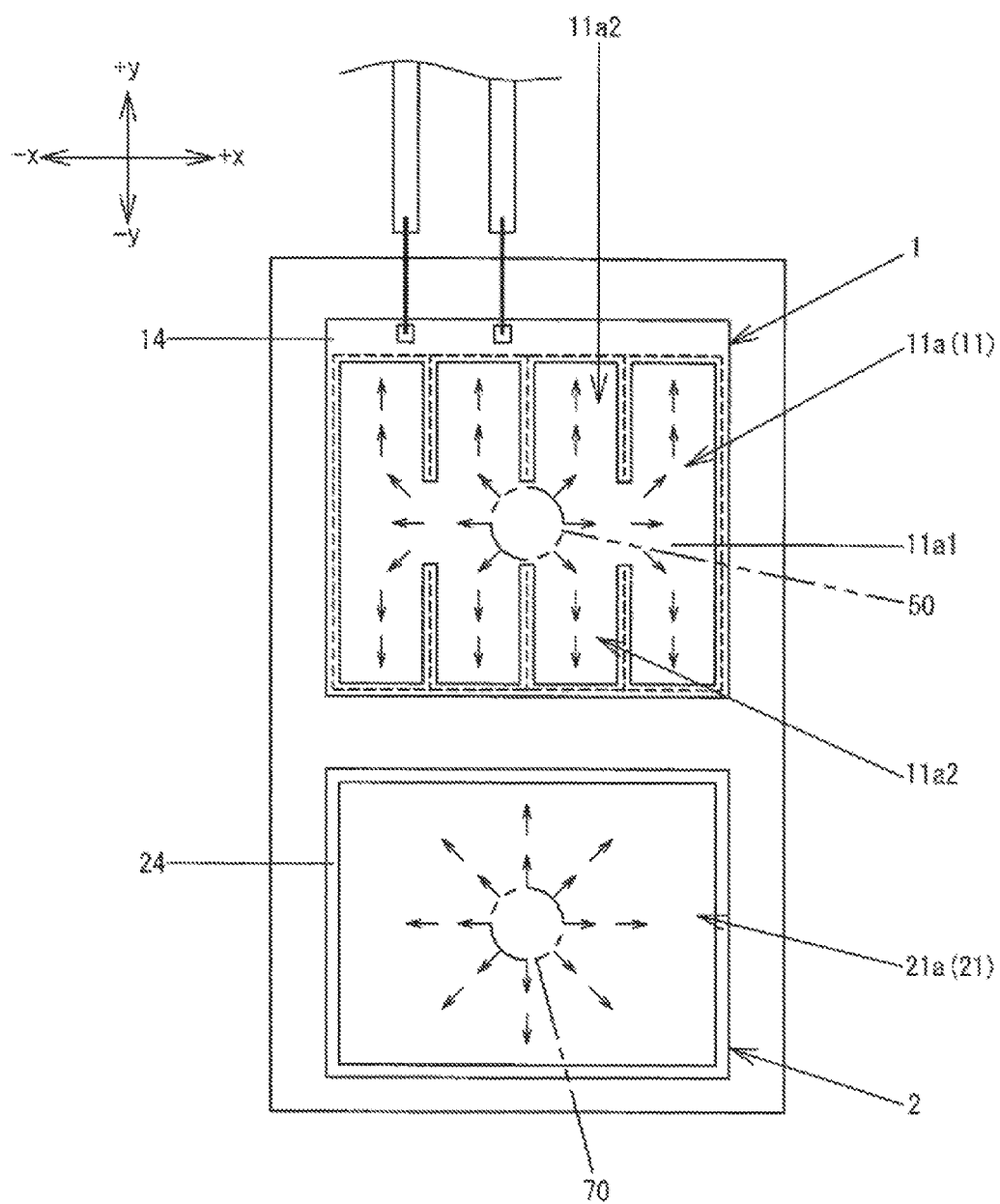
FIG. 10 is a schematic view illustrating the setting position of solder and the spreading directions of solder.

An embodiment of a manufacturing method of the power module according to the present invention is described with reference to FIGS. 9 and 10. FIG. 9 is a process diagram illustrating a manufacturing method of the power semiconductor unit 330, and FIG. 10 is a schematic view illustrating the setting positions of solders 5a and 7a and the spreading directions of the solders 5a and 7a.

The IGBT chip 1 and the diode chip 2, the first bus bar 3, and the second bus bar 4 are first prepared, and molten solders 6a and 8a are dropped on solder dropping regions of the surface of the second bus bar 4 as shown in FIG. 9(a). The solder dropping regions of the surface of the second bus bar 4 are a region facing the center position of the collector electrode surface 12a of the IGBT chip 1 and a region facing the center position of the cathode electrode surface 22a of the diode chip 2. The solder 6a is dropped on the solder dropping region of the second bus bar 4 facing the center position of the collector electrode surface 12a of the IGBT chip 1. The solder 8a is dropped on the solder dropping region of the second bus bar 4 facing the center position of the cathode electrode surface 22a of the diode chip 2.

As shown in FIG. 9(b), the IGBT chip 1 and the diode chip 2 are then positioned on the chip mounting surface of the second bus bar 4 such that the molten solder 6a is placed to face the center position of the collector electrode surface 12a of the IGBT chip 1 and the molten solder 8a is placed to face the center position of the cathode electrode surface 22a of the diode chip 2.

After positioning, the collector electrode surface 12a of the IGBT chip 1 and the cathode electrode surface 22a of the diode chip 2 are pressed against the molten solders 6a and 8a on the second bus bar 4 at the same time, and the molten solders 6a and 8a are spread on the collector electrode surface 12a and the cathode electrode surface 22a, respectively. This allows the collector electrode surface 12a of the IGBT chip 1 and the cathode electrode surface 22a of the diode chip 2 to be connected together to the second bus bar 4 with the solder 6 and 8 as shown in FIG. 9(c).

A component thus formed is referred to as a second bus bar assembly 30. As noted above, the collector electrode surface 12a of the IGBT chip 1 and the cathode electrode surface 22a of the diode chip 2 are rectangular in a plan view. Accordingly, the molten solders 6a and 8a placed at the centers of the corresponding electrode surfaces flow uniformly outward (radially) and spread over the corresponding entire electrode surfaces.

As shown in FIG. 9(d), molten solders 5a and 7a are dropped on dropping regions of the surface of the first bus bar 3. The dropping regions of the surface of the first bus bar 3 are a region facing a solder setting region 50 (see FIG. 10) located in the center of the emitter electrode surface 11a of the IGBT chip 1 and a region facing a solder setting region 70 (see FIG. 10) located in the center of the anode electrode surface 21a of the diode chip 2. The solder 5a is dropped on the dropping region of the first bus bar 3 facing the solder setting region 50, and the solder 7a is dropped on the dropping region of the first bus bar 3 facing the solder setting region 70.

As shown in FIG. 10, the solder setting region 50 is set so as to include part of the primary solder spreading electrode surface 11a1 constituting the emitter electrode surface 11a of the IGBT chip 1. As shown in FIG. 9(e), the second bus bar assembly 30 shown in FIG. 9(c) is turned over and the IGBT chip 1 and the diode chip 2 are positioned on the chip mounting surface of the first bus bar 3 such that the molten solder 5a is placed to face the solder setting region 50 (see FIG. 10) and the molten solder 7a is placed to face the solder setting region 70 (see FIG. 10).

After positioning, the emitter electrode surface 11a of the IGBT chip 1 and the anode electrode surface 21a of the diode chip 2 of the second bus bar assembly 30 turned over are pressed against the molten solders 5a and 7a on the first bus bar 3 at the same time.

By pressing the electrode surfaces 11a and 21a against the molten solders 5a and 7a, the molten solders 5a spreads outward (radially) from the solder setting region 50 of the emitter electrode surface 11a and the molten solders 7a spreads outward (radially) from the solder setting region 70 of the anode electrode surface 21a, as shown schematically by arrows in FIG. 10. As noted above, the anode electrode surface 21a of the diode chip 2 is rectangular in a plan view. Accordingly, the molten solders 7a flows uniformly outward (radially) from the solder setting region 70 in the center of the anode electrode surface 21a and spreads over the entire anode electrode surface 21a.

Figure 11:
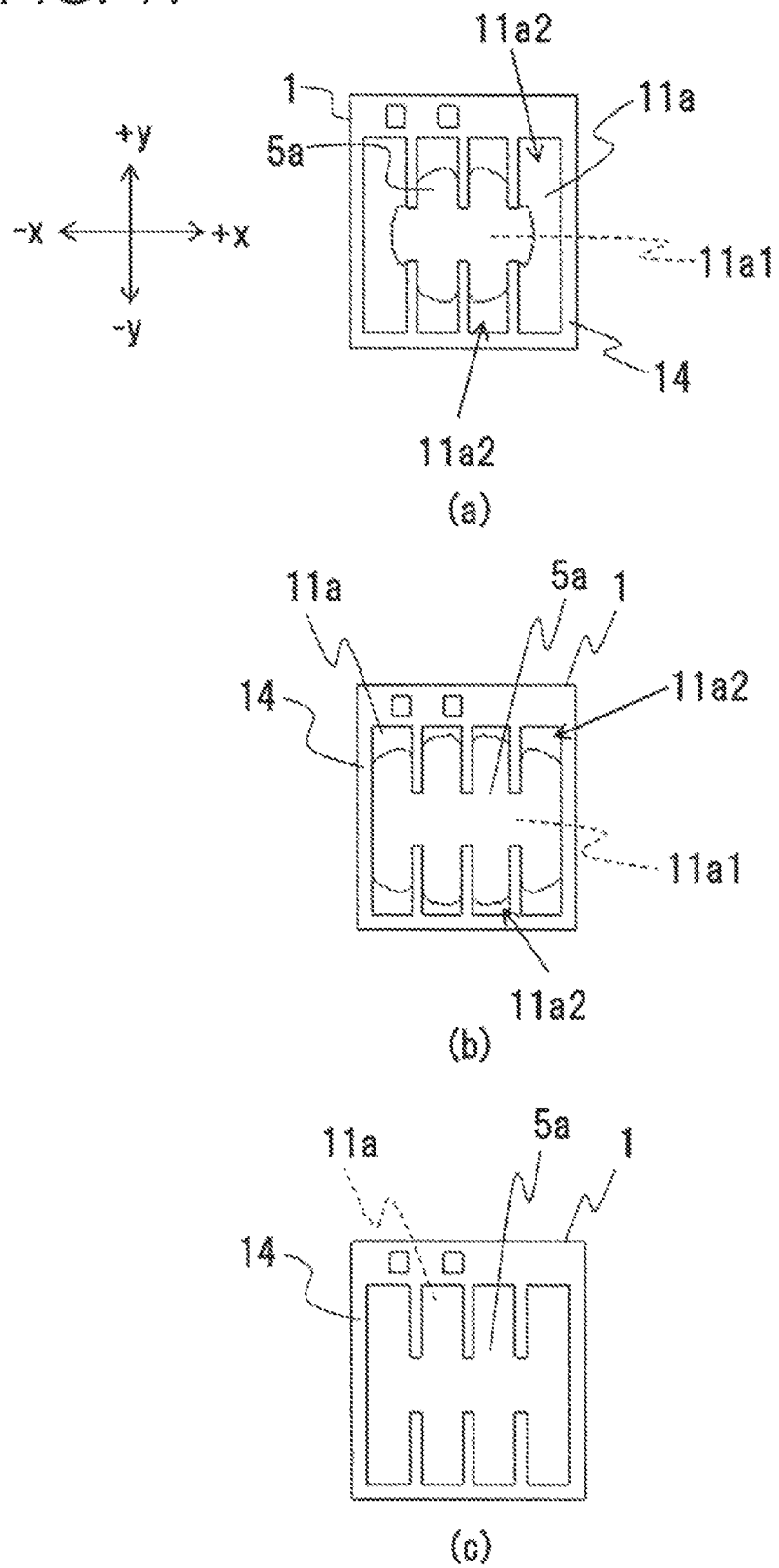
FIG. 11 is a schematic view illustrating a state where molten solder spreads on the emitter electrode surface of the IGBT chip.

Spreading of the solder 5a when the second bus bar assembly 30 is pressed against the molten solder 5a is described with reference to FIG. 11. FIG. 11 is a schematic view illustrating a state where the molten solder 5a spreads on the emitter electrode surface 11a of the IGBT chip 1.

When the emitter electrode surface 11a is pressed against the molten solder 5a, the molten solder 5a flows from the center of the primary solder spreading electrode surface 11a1 in the +x and −x directions as shown in FIGS. 11(a) to 11(c). The solder 5a advances from the primary solder spreading electrode surface 11a1 to the secondary solder spreading electrode surface 11a2 and flows toward the end of the secondary solder spreading electrode surface 11a2, i.e., in the +y and −y directions, at which time the molten solder 5a does not spread in the direction across the protective film 14. This is because, as described above, the wettability of the solder of the protective film 14 provided on the periphery of the double comb-shaped emitter electrode surface 11a including a space between the strip-shaped electrode surfaces adjacent to each other that constitute the secondary solder spreading electrode surface 11a2 is low compared to the emitter electrode surface 11a. In other words, the wettability of the emitter electrode surface 11a to the solder is good compared to the wettability of the protective film 14 to the solder.

As the distance between the first bus bar 3 and the IGBT chip 1 is reduced, the molten solder 5a spreads from the primary solder spreading electrode surface 11a1 to the secondary solder spreading electrode surface 11a2 along the double comb-shaped emitter electrode 11 (see FIGS. 11(a) and 11(b)), and finally spreads over the emitter electrode surface 11a (see FIG. 11(c)).

Thus, the solder 5a also can be uniformly spread on the emitter electrode surface 11a, and this may achieve reduction of solder 5a protrusion and the effect of reducing voids.

When the solders 5a and 7a, which are spread over the entire electrode surfaces 11a and 21a, are cooled, the first bus bar 3 is connected to the emitter electrode surface 11a of the IGBT chip 1 by the solder 5 and the first bus bar 3 is connected to the anode electrode surface 21a of the diode chip 2 by the solder 7, as shown in FIG. 9(f).

Furthermore, although not shown, each of the electrode surfaces of the terminal electrodes 13 (13a, 13b) of the IGBT chip 1 and the gate pin 9 are electrically connected by the aluminum wire 10, members including the first bus bar 3 and the second bus bar 4 are sealed by the sealing member 20, and thus the power semiconductor unit 330 is completed (see FIG. 5).

Figure 12:
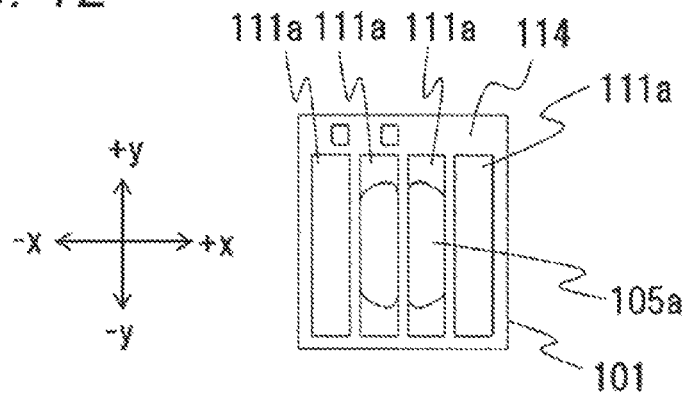
FIG. 12 is a schematic view illustrating a state where molten solder spreads on the emitter electrode surfaces of a conventional IGBT chip.
Figure 12:
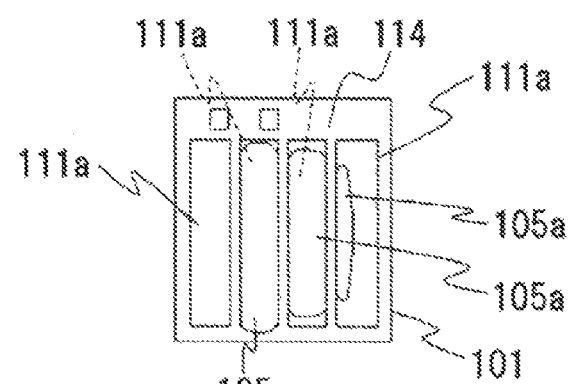
Figure 12:
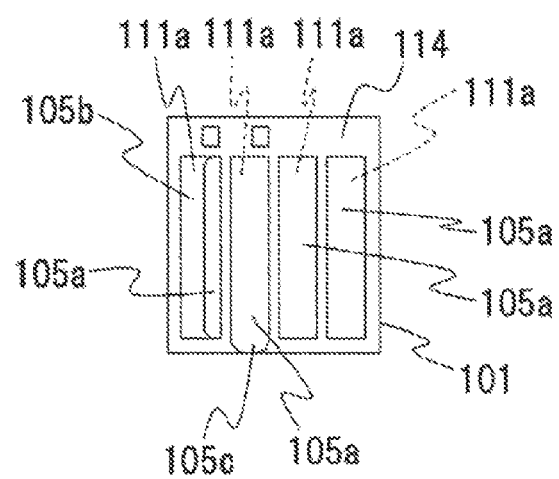

FIG. 12 is a schematic view illustrating a state where molten solder 105a spreads on emitter electrode surfaces 111a of a conventional IGBT chip 101. As shown in FIG. 12, the conventional IGBT chip 101 is provided with a plurality of strip-shaped emitter electrode surfaces 111a. Note that the wettability of a protective film 114 interposed between adjacent strip-shaped emitter electrode surfaces 111a to the solder 105a is low compared to the wettability of the emitter electrode surface 111a to the solder 105a.

When the emitter electrode surfaces 111a are pressed against the molten solder 105a in a manner similar to FIG. 9, spreading of the molten solder 105a is limited by the protective film 114, so that the spreading direction of the solder 105a on the emitter electrode surfaces 111a is mainly the y direction as shown in FIG. 12(a). Accordingly, the solder 105a flows too much in the y direction as shown in FIG. 12(b).

Consequently, as shown in FIG. 12(c), the solder 105a does not spread over the entire emitter electrode surfaces 111a, so that a non-solder-wetting area 105b where the solder 105a is not present on the emitter electrode surface 111a may be formed, and the solder 105a may flow beyond the emitter electrode surface 111a to cause a solder flow 105c.

JP 2006-210519 A discloses a technique to improve the connection with the solder by providing a polyimide film (insulating protective film) with a metal foil. This conventional technique can uniformly spread the solder on a chip. However, the conventional technique, where the polyimide film is provided with the metal foil, is expensive. In addition, new junctions of the metal foil and the solder as well as the polyimide film and the metal foil may reduce the life of the joint.

The present embodiment described above has the following effects:

(1) The emitter electrode surface 11a is double comb-shaped with the secondary solder spreading electrode surface 11a2 extending in a comb-like manner from the primary solder spreading electrode surface 11a1 to both sides thereof. The periphery of the electrode surface 11a is provided with a protective film 14 having low solder wettability so as to cover the aluminum gate wiring 15. The molten solder 5a placed in the center portion of the emitter electrode surface 11a, which is sandwiched by the emitter electrode surface 11a and the first bus bar 3, flows radially and flows uniformly on the primary solder spreading electrode surface 11a1 and the secondary solder spreading electrode surface 11a2, while a solder flow beyond the emitter electrode surface 11a can be prevented.

(2) The molten solder spreads evenly and radially on the electrode surfaces and this can discharge voids onto the outer peripheral sides of the electrodes to reduce the voids.

(3) The above-described (1) and (2) improve the life of solder joints and manufacturing yield, thereby achieving a high reliability and a low cost of a power module.

(4) The present embodiment is inexpensive as compared to the conventional technique described in JP 2006-210519 A above, in which a protective film needs to be provided with a new metal foil.

(5) When a bus bar and a semiconductor device are connected with solder as described in the present embodiment, the solder wettability of the bus bar affects the connection of the semiconductor device and the solder. If the solder wettability of the bus bar is too good, the solder spreads mainly on the side of the bus bar, while it is less likely to spread on the side of the semiconductor device. On the contrary, if the solder wettability of the bus bar is poor, the solder is less likely to spread on the side of the bus bar, and it spreads too much on the side of the semiconductor device. In the present embodiment, the first bus bar 3 and the second bus bar 4 are made of copper material, and surface treatment such as plating is not applied to the surface to be soldered. Thus, when soldering, changing the temperature of the bus bars, for example, by heating the bus bars can adjust the wettability of the bus bars to the solder, thereby easily improving the connectability between the semiconductor device and the solder.

(6) A method is employed that connects the IGBT chip 1 and the diode chip 2 together to the first bus bar 3 and connects the IGBT chip 1 and the diode chip 2 together to the second bus bar 4. This can achieve reduction of bonding time, i.e., manufacturing process, thereby reducing the manufacturing cost.

(7) Nickel plating applied to the double comb-shaped emitter electrode surface 11a can improve the wettability of the solder.

The following modifications are also within the scope of the invention, and one or more modifications may be combined with the embodiments described above.

Figure 13:
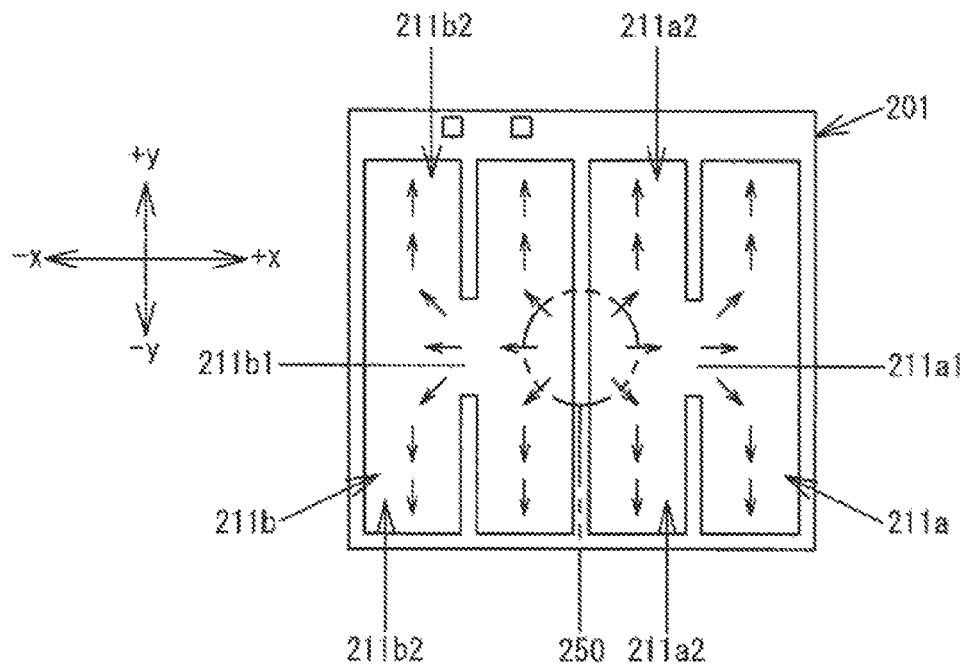
FIG. 13 is a schematic view illustrating the setting position of solder and the spreading directions of solder on the emitter electrode surface of an IGBT chip according to a modification.
Figure 13:
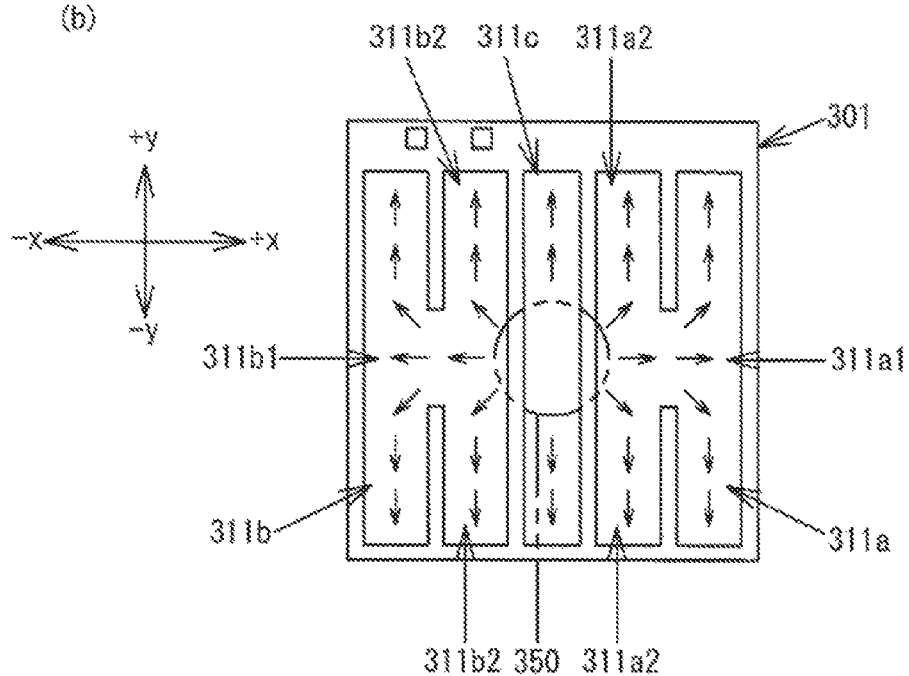

(1) The shape of the electrode surfaces of the power module according to the present invention is not limited to the above-mentioned embodiments. For example, as shown in FIG. 13(a), an IGBT chip 201 may be provided with a plurality of double comb-shaped electrode surfaces 211a and 211b. The IGBT chip 201 shown in FIG. 13(a) is provided with the electrode surfaces 211a and 211b evenly divided in the x direction. One electrode surface 211a has a primary solder spreading electrode surface 211a1 extending in the x direction and a secondary solder spreading electrode surface 211a2 extending in a comb-like manner from the primary solder spreading electrode surface 211a1 to both sides, i.e., in the +y and −y directions. Likewise, the other electrode surface 211b has a primary solder spreading electrode surface 211b1 extending in the x direction and a secondary solder spreading electrode surface 211b2 extending in a comb-like manner from the primary solder spreading electrode surface 211b1 to both sides, i.e., in the +y and −y directions.

As illustrated, a solder setting region 250 is set substantially in the center of the IGBT chip 201 so as to include part of the primary solder spreading electrode surfaces 211a1 and 211b1. When the bus bar is pressed against molten solder set on the one electrode surface 211a, the molten solder flows along the shape of the electrode surface 211a, that is, in the +x direction and in the +y and −y directions so as to move from the primary solder spreading electrode surface 211a1 to the secondary solder spreading electrode surface 211a2, and spreads over the electrode surface 211a. Likewise, when the bus bar is pressed against molten solder set on the other electrode surface 211b, the molten solder flows along the shape of the electrode surface 211b, that is, in the −x direction and in the +y and −y directions so as to move from the primary solder spreading electrode surface 211b1 to the secondary solder spreading electrode surface 211b2, and spreads over the electrode surface 211b. This can prevent solder protrusion, which is caused by the molten solder overflowing from the electrode surfaces 211a and 211b, and voids are further reduced.

(2) The present invention is not limited to the case where all of emitter electrode surfaces formed on one side of an IGBT chip are double comb-shaped. If a plurality of emitter electrode surfaces are formed on one side of a semiconductor device, at least one electrode surface is formed in a double comb-shape. For example, as shown in FIG. 13(b), double comb-shaped electrode surfaces 311a and 311b and a strip-shaped electrode surface 311c may be formed on one side of an IGBT chip 301. In the IGBT chip 301 shown in FIG. 13(b), a solder setting region 350 is set substantially in the center of the IGBT chip 301 so as to include part of the electrode surfaces 311a and 311b as illustrated. When the bus bar is pressed against the molten solder set on the one electrode surface 311a, molten solder flows along the shape of the electrode surface 311a, that is, in the +x direction and in the +y and −y directions so as to move from a primary solder spreading electrode surface 311a1 to a secondary solder spreading electrode surface 311a2, and spreads over the electrode surface 311a. Likewise, when the bus bar is pressed against molten solder set on the other electrode surface 311b, molten solder flows along the shape of the electrode surface 311b, that is, in the −x direction and in the +y and −y directions so as to move from a primary solder spreading electrode surface 311b1 to a secondary solder spreading electrode surface 311b2, and spreads over the electrode surface 311b. This can prevent solder protrusion, which is caused by the molten solder overflowing from the electrode surfaces 311a and 311b, and voids are further reduced.

(3) Although, in the embodiments described above, the IGBT chip of 10 mm×10 mm is provided with four pairs of strip-shaped electrode surfaces extending from the primary solder spreading electrode surface as shown in FIG. 6, the present invention is not limited thereto. A large-sized IGBT chip may be provided with five or more pairs of strip-shaped electrode surfaces, while a small-sized semiconductor device may be provided with two or three pairs of strip-shaped electrode surfaces. The number of the strip-shaped electrode surfaces is determined according to the size of the IGBT chip, and the shape of the strip-shaped electrode surface is not limited to a rectangular shape in a plan view.

Figure 14:
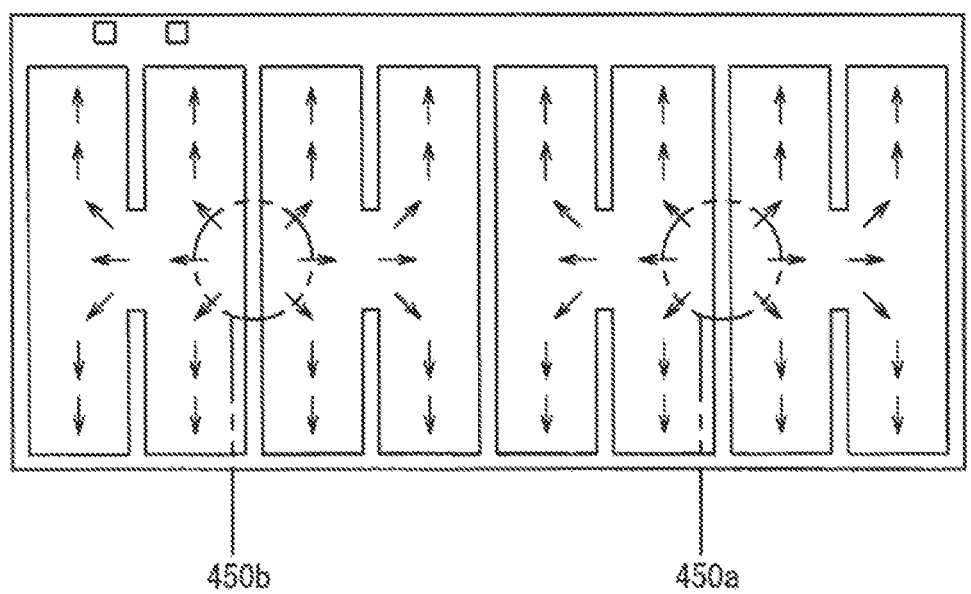
FIG. 14 is a schematic view illustrating the setting position of solder and the spreading directions of solder on the emitter electrode surface of an IGBT chip according to a modification.
Figure 14:
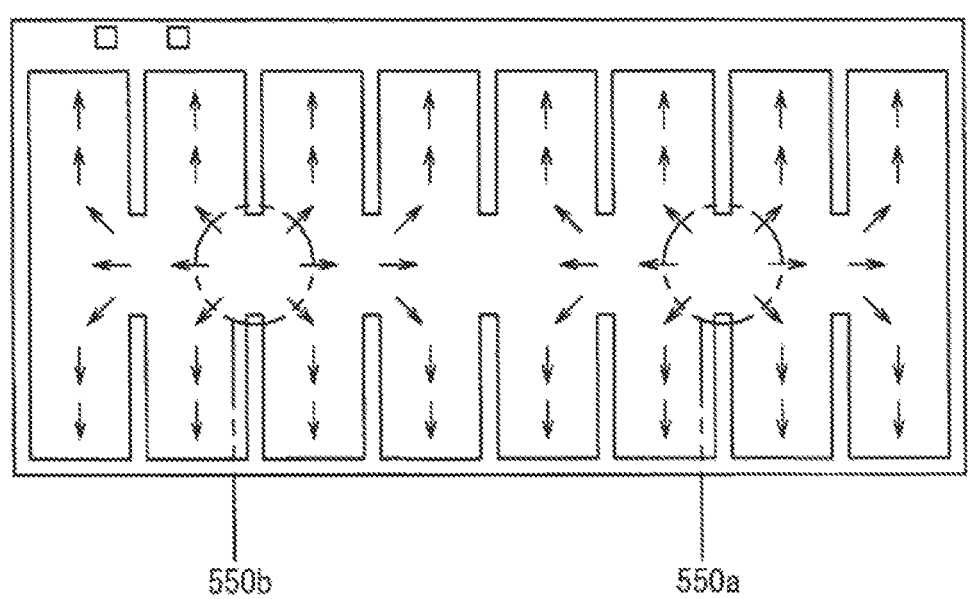

(4) Although the molten solder is dropped at a position substantially in the center of the electrode surface of the semiconductor device in the embodiments described above, the present invention is not limited thereto. The molten solder may be dropped at a plurality of positions according to the shape of the electrode surface. For example, the present invention is applicable for the cases where four emitter electrode surfaces, each having two pairs of strip-shaped electrode surfaces, are arranged as shown in FIG. 14(a), and where a single emitter electrode surface having eight pairs of strip-shaped electrode surfaces is disposed as shown in FIG. 14(b). As shown in FIG. 14(a), the molten solder is dropped and pushed out at two regions, i.e., a solder setting region 450a and a solder setting region 450b including parts of the primary solder spreading electrode surfaces, and the solder flows radially from the solder setting region so as to move from the primary solder spreading electrode surface to the secondary solder spreading electrode surface, being allowed to spread over the entire electrode surfaces. As shown in FIG. 14(b), the molten solder is dropped and pushed out at two regions, i.e., a solder setting region 550a and a solder setting region 550b including parts of the primary solder spreading electrode surface, and the solder flows radially from the solder setting region so as to move from the primary solder spreading electrode surface to the secondary solder spreading electrode surface, being allowed to spread over the entire electrode surfaces. The position, the number, and the area of the solder setting regions are determined appropriately according to the size of the IGBT chip, the number of the electrode surfaces, the shape of the electrode surface, etc.

(5) The electrode surface of the power module according to the present invention may be formed into various shapes, each having a primary solder spreading electrode surface and a secondary solder spreading electrode surface extending in a comb-like manner from the primary solder spreading electrode surface to both sides thereof. Other examples of the electrode surface are described with reference to FIGS. 15(a) to 15(c).

Figure 15:
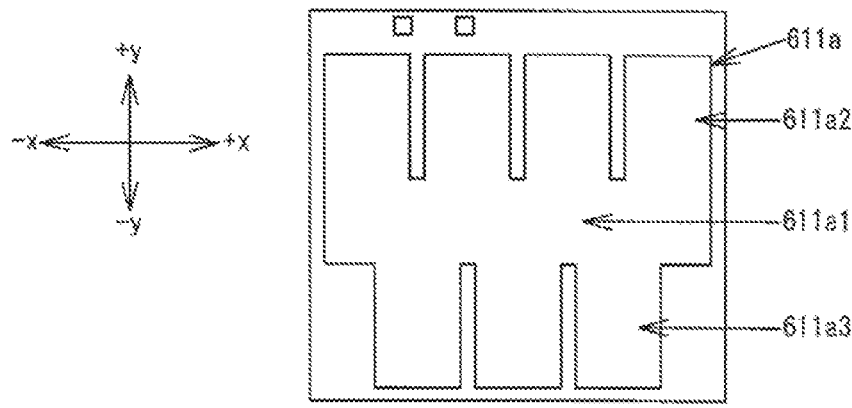
FIG. 15 is a schematic view illustrating the emitter electrode surface of an IGBT chip according to a modification.
Figure 15:
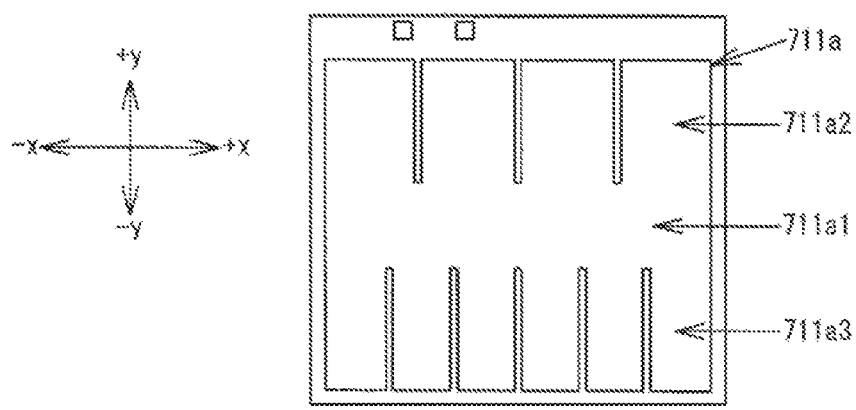
Figure 15:
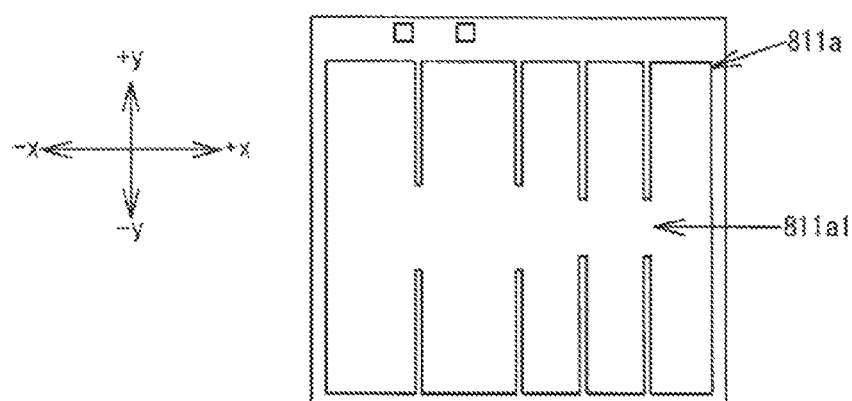

An electrode surface 611a shown in FIG. 15(a) has a primary solder spreading electrode surface 611a1 extending in the x direction, a secondary solder spreading electrode surface 611a2 extending in a comb-like manner in the +y direction from the primary solder spreading electrode surface 611a1, and a secondary solder spreading electrode surface 611a3 extending in a comb-like manner in the −y direction from the primary solder spreading electrode surface 611a1. In this modified example, the secondary solder spreading electrode surface 611a2 extending in the +y direction has four strip-shaped electrode surfaces, while the secondary solder spreading electrode surface 611a3 extending in the −y direction has three strip-shaped electrode surfaces.

A electrode surface 711a shown in FIG. 15(b) has a primary solder spreading electrode surface 711a1 extending in the x direction, a secondary solder spreading electrode surface 711a2 extending in a comb-like manner in the +y direction from the primary solder spreading electrode surface 711a1, and a secondary solder spreading electrode surface 711a3 extending in a comb-like manner in the −y direction from the primary solder spreading electrode surface 711a1. The secondary solder spreading electrode surface 711a2 extending in the +y direction has four strip-shaped electrode surfaces, while the secondary solder spreading electrode surface 711a3 extending in the −y direction has six strip-shaped electrode surfaces. In this modified example, the width in the x direction of each of the strip-shaped electrode surfaces of the secondary solder spreading electrode surface 711a2 is different from that of each of the strip-shaped electrode surfaces of the secondary solder spreading electrode surface 711a3.

An electrode surface 811a shown in FIG. 15(c) has three pairs of narrow strip-shaped electrode surfaces and two pairs of wide strip-shaped electrode surfaces, these electrode surfaces extending from a primary solder spreading electrode surface 811a1 to both sides (in the +y and −y directions).

As shown in FIGS. 15(a) to 15(c), the primary solder spreading electrode surface extending in one direction and the secondary solder spreading electrode surface extending in a comb-like manner from the primary solder spreading electrode surface to both sides thereof allows the solder placed at a solder setting region including the primary solder spreading electrode surface to spread over the entire electrode surfaces.

(6) The manufacturing method of the power semiconductor unit 330 according to the present invention is not limited to that shown in FIG. 9. For example, the following method may be employed that includes: dropping the molten solders 6*a* and 8*a* on the IGBT chip 1 and the diode chip 2, pressing the second bus bar 4 against the molten solders 6*a* and 8*a* from above, with the IGBT chip 1 and the diode chip 2 being disposed downward, connecting the second bus bar 4 and the IGBT chip 1 and the diode chip 2 with the solder 6 and 8 to form the second bus bar assembly 30, turning over and placing the second bus bar assembly 30 thereafter, dropping the molten solders 5*a* and 7*a* on the IGBT chip 1 and the diode chip 2, pressing the first bus bar 3 against the molten solders 5*a* and 7*a* from above, with the second bus bar assembly 30 being disposed downward, and connecting the first bus bar 3 and the IGBT chip 1 and the diode chip 2 are connected with solder 5 and 7.

(7) The present invention is not necessarily limited to the case where the IGBT chip 1 and the diode chip 2 are simultaneously moved toward the second bus bar 4 and are joined together. The connection of the second bus bar 4 and the IGBT chip 1 and the diode chip 2 and the connection of the first bus bar 3 and the IGBT chip 1 and the diode chip 2 may be performed in reverse order.

(8) Although, in the embodiments described above, a dropping method is employed whereby molten solder is dropped and electrode surfaces of a semiconductor device and a bus bar are connected with solder, the present invention is not limited thereto. A method may be employed whereby cream solder is placed at a solder setting region, then enters, for example, a heating furnace, and is caused to reflow.

The process for the case of adopting this method will be described. In the first step, a semiconductor device having at least one double comb-shaped electrode surface on one side thereof, a first conductive member, and a second conductive member are prepared. In the second step, an electrode surface provided on the other side of the semiconductor device is connected to the second conductive member with solder. In the third step, the cream solder is placed at a predetermined region including part of a primary solder spreading electrode surface constituting a double comb-shaped electrode surface of the semiconductor device, for example, at the solder setting region 50 of FIG. 10 or at a region of the first conductive member facing the predetermined region.

In the fourth step, the cream solder is melted by heating, the molten solder is spread from the primary solder spreading electrode surface to a secondary solder spreading electrode surface by reducing a distance between the first conductive member and the electrode surface provided on the one side of the semiconductor device, and the electrode surface provided on the one side of the semiconductor device is connected to the first conductive member with solder. In the fifth step, the first and second conductive members are sealed with a sealing member.

In this manner, after the cream solder is set at the predetermined region, the cream solder is molten by heating, the conductive members and the electrode surfaces of the semiconductor device are moved closer to each other, and thus the molten solder can be spread over the electrode surfaces.

(9) Although an IGBT is employed as a switching semiconductor device in the embodiments described above, other semiconductor devices, for example, such as a metal-oxide-semiconductor field-effect transistor (MOSFET) may be employed depending on the required voltage and frequency.

As the switching semiconductor device, the IGBT is suitable for relatively high DC voltage, while the MOSFET is suitable for relatively low DC voltage.

(10) Although the electrode surface of the emitter electrode is double comb-shaped in the embodiments described above, the present invention is not limited thereto. At least one of the electrode surfaces provided on the one side of the semiconductor device only needs to be double comb-shaped.

(11) Although, in the embodiments above, a power module incorporated in a power converter mounted on a hybrid electric car and a pure electric car is described, the present invention is not limited thereto. The present invention may be applicable to power modules mounted on power converters available to power supplies for other vehicles, for example, railway vehicles such as a hybrid electric train, vehicles carrying passengers such as a bus, vehicles used to carry goods such as a truck, and industrial vehicles such as a battery-powered forklift truck.

While various embodiments and modifications are described above, the present invention is not limited thereto. Other embodiments contemplated in the technical ideas of the present invention are included within the scope of the present invention.

The disclosure of the following priority-based application is incorporated herein by reference:

Japanese Patent Application No. 2011-144593 (filed on Jun. 29, 2011)

The invention claimed is:

1. A power module, comprising:
   a semiconductor device having a first electrode surface and a second electrode surface that is formed on a backside of the first electrode surface;
   a first conductive member connected to one of the first or second electrode surface provided on one side of the semiconductor device with solder; and
   a second conductive member connected to another of the first or second electrode surface provided on the other side of the semiconductor device with solder, wherein
   at least one of the electrode surfaces provided on the one side of the semiconductor device is double comb-shaped,
   a current is inputted into the first electrode surface, and a current is outputted from the second electrode surface.

2. The power module according to claim 1, wherein the double comb-shaped electrode surface has a primary solder spreading electrode surface and a secondary solder spreading electrode surface extending in a comb-like manner from the primary solder spreading electrode surface to both sides thereof.

3. The power module according to claim 1, wherein a periphery of the double comb-shaped electrode surface is provided with a gate wiring, and
   the gate wiring is covered with a protective film having low wettability to solder compared to the double comb-shaped electrode surface and insulating properties.

4. The power module according to claim 1, wherein the first and second conductive members are made of copper material, and no surface treatment is applied to a surface of the first and second conductive members to be soldered.

5. The power module according to claim 1, wherein nickel plating to improve the wettability to solder is applied to the double comb-shaped electrode surface.

6. A method of manufacturing the power module according to claim 2, comprising:
   preparing the semiconductor device having at least one double comb-shaped electrode surface, the first conductive member, and the second conductive member;

connecting the electrode surface provided on the other side of the semiconductor device to the second conductive member with solder;

dropping molten solder on a predetermined region including part of the primary solder spreading electrode surface constituting the double comb-shaped electrode surface of the semiconductor device or on a region of the first conductive member facing the predetermined region; and spreading the molten solder from the primary solder spreading electrode surface to the secondary solder spreading electrode surface by reducing a distance between the first conductive member and the electrode surface provided on the one side of the semiconductor device and connecting the electrode surface provided on the one side of the semiconductor device to the first conductive member with solder.

7. A method of manufacturing the power module according to claim 2, comprising:

preparing the semiconductor device having at least one double comb-shaped electrode surface, the first conductive member, and the second conductive member;

connecting the electrode surface provided on the other side of the semiconductor device to the second conductive member with solder;

dropping molten solder on a dropping region of the first conductive member;

performing positioning such that the solder dropped on the dropping region is disposed so as to face a predetermined region including part of the primary solder spreading electrode surface constituting the double comb-shaped electrode surface provided on the one side of the semiconductor device; and moving the one side of the semiconductor device toward the first conductive member, spreading the molten solder from the primary solder spreading electrode surface to the secondary solder spreading electrode surface, and connecting the electrode surface provided on the one surface of the semiconductor device to the first conductive member with solder.

8. A method of manufacturing the power module according to claim 2, comprising:

preparing the semiconductor device having at least one double comb-shaped electrode surface, the first conductive member, and the second conductive member;

connecting the electrode surface provided on the other side of the semiconductor device to the second conductive member with solder;

placing solder at a predetermined region including part of the primary solder spreading electrode surface constituting the double comb-shaped electrode surface of the semiconductor device or at a region of the first conductive member facing the predetermined region; and melting the solder by heating, spreading the molten solder from the primary solder spreading electrode surface to the secondary solder spreading electrode surface by reducing a distance between the first conductive member and the electrode surface provided on the one side of the semiconductor device, and connecting the electrode surface provided on the one side of the semiconductor device to the first conductive member with solder.

9. A power module, comprising:

an IGBT chip and a diode chip;

a first conductive plate that is connected with solder to at least one emitter electrode surface provided on one side of the IGBT chip and to an anode electrode surface provided on one side of the diode chip; and a second conductive plate that is connected with solder to a collector electrode surface provided on the other side of the IGBT chip and to a cathode electrode surface provided on the other side of the diode chip, wherein at least one of the emitter electrode surfaces provided on the one side of the IGBT chip is double comb-shaped, the double comb-shaped electrode surface has a primary solder spreading electrode surface and a secondary solder spreading electrode surface extending in a comb-like manner from the primary solder spreading electrode surface to both sides thereof, a periphery of the emitter electrode surface is provided with a gate wiring, and the gate wiring is covered with a protective film having low wettability to solder compared to the emitter electrode surface and insulating properties.

10. A method of manufacturing the power module according to claim 9, comprising:

preparing the IGBT chip having at least one double comb-shaped emitter electrode surface, the diode chip, the first conductive plate, and the second conductive plate;

dropping molten solder at the center positions of the collector electrode surface of the IGBT chip and the cathode electrode surface of the diode chip or at predetermined positions of the second conductive plate facing the center positions thereof;

simultaneously moving the collector electrode surface of the IGBT chip and the cathode electrode surface of the diode chip toward the second conductive plate, spreading the molten solder on the collector electrode surface and the cathode electrode surface, and connecting the collector electrode surface of the IGBT chip and the cathode electrode surface of the diode chip to the second conductive plate with solder;

dropping molten solder at a predetermined region including part of the primary solder spreading electrode surface constituting the emitter electrode surface of the IGBT chip and at the center position of the anode electrode surface of the diode chip or at predetermined positions of the first conductive plate facing the predetermined region and the center position of the anode electrode surface; and simultaneously moving the emitter electrode surface of the IGBT chip and the anode electrode surface of the diode chip toward the first conductive plate, spreading the molten solder from the primary solder spreading electrode surface to the secondary solder spreading electrode surface of the emitter electrode surface and spreading the molten solder on the anode electrode surface, and connecting the emitter electrode surface of the IGBT chip and the anode electrode surface of the diode chip to the first conductive plate with solder.

11. A power module, comprising:

an upper arm IGBT chip and an upper arm diode chip and a lower arm IGBT chip and a lower arm diode chip that make up an upper arm and a lower arm of an inverter circuit;

a second AC electrode lead frame that is connected with solder to at least one emitter electrode surface provided on one side of the upper arm IGBT chip and to an anode electrode surface provided on one side of the upper arm diode chip;

a DC positive electrode lead frame that is connected with solder to a collector electrode surface provided on the other side of the upper arm IGBT chip and to a cathode electrode surface provided on the other side of the upper arm diode chip;

a DC negative electrode lead frame that is connected with solder to at least one emitter electrode surface provided on one side of the lower arm IGBT chip and to an anode electrode surface provided on one side of the lower arm diode chip; and a first AC electrode lead frame that is connected with solder to a collector electrode surface provided on the other side of the lower arm IGBT chip and to a cathode electrode surface provided on the other side of the lower arm diode chip, wherein at least one of the emitter electrode surfaces provided on each of the one side of the upper arm IGBT chip and the lower arm IGBT chip is double comb-shaped, the double comb-shaped electrode surface has a primary solder spreading electrode surface and a secondary solder spreading electrode surface extending in a comb-like manner from the primary solder spreading electrode surface to both sides thereof, a periphery of the emitter electrode surface is provided with a gate wiring, and the gate wiring is covered with a protective film having low wettability to solder compared to the emitter electrode surface and insulating properties.

\* \* \* \* \*